(12) United States Patent
Kung et al.

(10) Patent No.: US 11,348,885 B2
(45) Date of Patent: May 31, 2022

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Cheng-Yuan Kung, Kaohsiung (TW); Hung-Yi Lin, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 8 days.

(21) Appl. No.: 16/732,154

(22) Filed: Dec. 31, 2019

(65) Prior Publication Data
US 2021/0202409 A1 Jul. 1, 2021

(51) Int. Cl.
| | |
|---|---|
| *H01L 23/66* | (2006.01) |
| *H01L 23/498* | (2006.01) |
| *H01L 25/16* | (2006.01) |
| *H01L 23/00* | (2006.01) |
| *H01L 25/00* | (2006.01) |
| *H01L 23/552* | (2006.01) |
| *H01L 21/48* | (2006.01) |
| *H01L 21/56* | (2006.01) |

(52) U.S. Cl.
CPC .......... *H01L 23/66* (2013.01); *H01L 21/4853* (2013.01); *H01L 21/4857* (2013.01); *H01L 21/568* (2013.01); *H01L 23/49822* (2013.01); *H01L 23/49833* (2013.01); *H01L 24/16* (2013.01); *H01L 25/16* (2013.01); *H01L 25/50* (2013.01); *H01L 23/49816* (2013.01); *H01L 23/552* (2013.01); *H01L 2223/6655* (2013.01); *H01L 2224/16225* (2013.01)

(58) Field of Classification Search
None
See application file for complete search history.

(56) References Cited

U.S. PATENT DOCUMENTS

2020/0067459 A1* 2/2020 Ahmed .............. H01L 23/49811
2021/0075374 A1* 3/2021 Wang ...................... H03F 3/604

* cited by examiner

*Primary Examiner* — Jay C Chang
(74) *Attorney, Agent, or Firm* — Foley & Lardner LLP

(57) ABSTRACT

A semiconductor package structure includes a redistribution structure and an impedance matching device. The redistribution structure includes a first surface, a second surface opposite to the first surface and a circuitless region extending from the first surface to the second surface. The impedance matching device is disposed on the redistribution structure and includes at least one impedance matching circuit aligned with the circuitless region.

18 Claims, 36 Drawing Sheets

SEMICONDUCTOR PACKAGE STRUCTURE AND METHOD FOR MANUFACTURING THE SAME

BACKGROUND

1. Field of the Disclosure

The present disclosure relates to a semiconductor package structure and a manufacturing method, and to a semiconductor package structure including at least one redistribution structure for electrical connection and impedance matching and a method for manufacturing the semiconductor package structure.

2. Description of the Related Art

With the rapid progress of semiconductor processing technologies, semiconductor devices are integrated with an increasing number of electronic components to achieve better electrical performance and more functions. Accordingly, the semiconductor devices are provided with more input/output (I/O) connections. To manufacture semiconductor packages including semiconductor devices with an increased number of I/O connections, the number of circuit layers of semiconductor substrates used for carrying the semiconductor device may correspondingly increase. Thus, a whole thickness of the semiconductor substrate may correspondingly increase, and an impedance matching operation for the semiconductor device may become more difficult.

SUMMARY

In some embodiments, a semiconductor package structure includes a redistribution structure and an impedance matching device. The redistribution structure includes a first surface, a second surface opposite to the first surface and a circuitless region extending from the first surface to the second surface. The impedance matching device is disposed on the redistribution structure and includes at least one impedance matching circuit aligned with the circuitless region.

In some embodiments, a semiconductor package structure includes a conductive structure, a lower resolution impedance-matchable device, a higher resolution impedance-matchable device and at least one electrical element. The conductive structure has an upper surface and a lower surface opposite to the upper surface. The lower resolution impedance-matchable device is disposed on the conductive structure and includes a redistribution structure and a first electronic component disposed on the redistribution structure. The higher resolution impedance-matchable device is disposed on the conductive structure. The electrical element is disposed on the lower surface of the conductive structure.

In some embodiments, a method for manufacturing a semiconductor package structure includes: providing a conductive structure including a ground plane; and disposing a first impedance-matchable device on the conductive structure to align with the ground plane.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
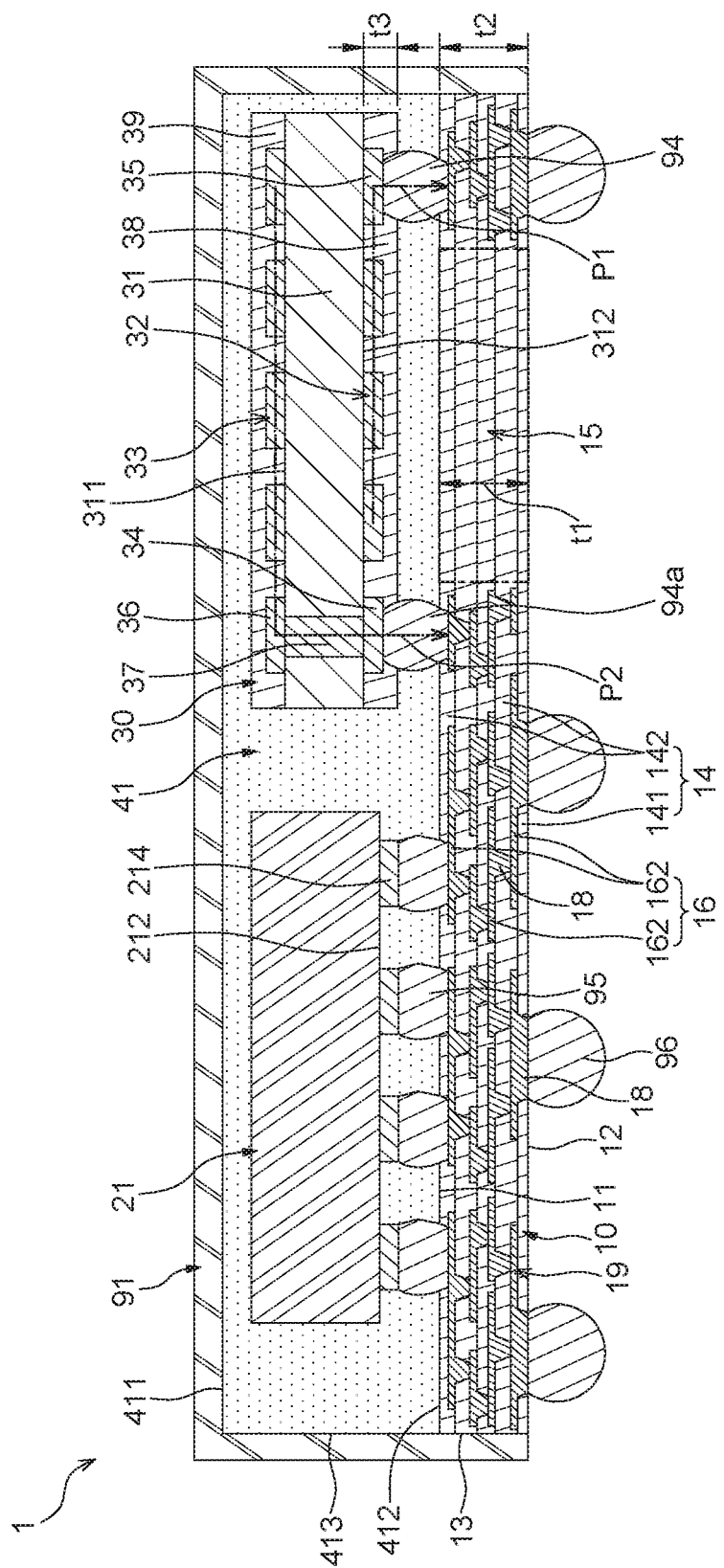
FIG. 1 illustrates a cross-sectional view of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of a semiconductor package structure 1 according to some embodiments of the present disclosure. The semiconductor package structure 1 includes a redistribution structure 10, an impedance matching device (including, for example, a transformer 30), at least one semiconductor device 21, a encapsulant 41, a shielding layer 91, at least one first electrical contact (including, for example, an electrical contact 94 and an electrical contact 94a), a plurality of second electrical contacts 95 and a plurality of third electrical contacts 96. In some embodiments, the semiconductor package structure 1 may be an impedance-matchable device.

The redistribution structure 10 includes a first surface 11, a second surface 12 opposite to the first surface 11, a peripheral surface 13 extending between the first surface 11 and the second surface 12, a dielectric structure 14, a circuitless region 15, a redistribution layer 16, a plurality of inner vias 18 and an impedance matchable circuit 19. The dielectric structure 14 may include a first dielectric layer 141 and at least one second dielectric layer 142. The second dielectric layer 142 may be disposed on a top surface of the first dielectric layer 141. The first dielectric layer 141 and the second dielectric layer 142 may be made of a cured photo-imageable dielectric (PID) material such as epoxy or polyimide (PI) including photoinitiators.

The circuitless region 15 may extend from the first surface 11 (e.g., a top surface of the dielectric structure 14) to the second surface 12 (e.g., a bottom surface of the dielectric structure 14). That is, a thickness t1 of the circuitless region 15 is substantially equal to a thickness t2 of the redistribution structure 10 from the first surface 11 to the second surface 12. In some embodiments, the circuitless region 15 may include a portion of the first dielectric layer 141 and a portion of the second dielectric layer 142. The redistribution layer 16 may be embedded in the dielectric structure 14 and may include a plurality of circuit layers 162. The redistribution layer 16 may be disposed outside the circuitless region 15. That is, the circuit layers 162 may not extend into the circuitless region 15. There may be no circuit layer in the circuitless region 15. The circuit layer 162 may be a fan-out circuit layer, and a line width/line space (L/S) of the circuit layer 162 may be less than or equal to 2 µm/2 µm, or less than or equal to 1.8 µm/1.8 µm. A material of the circuit layer 162 may be, for example, copper. The inner vias 18 may electrically connect at least one circuit layer 162 or two adjacent circuit layers 162 of the redistribution layer 16. Further, the inner vias 18 may taper toward the second surface 12. As shown in FIG. 1, the topmost second dielectric layer 142 may cover the topmost circuit layer 162, and may define a plurality of openings to expose portions of the topmost circuit layer 162. The impedance matchable circuit 19 may be electrically connected to the circuit layer 162 of the redistribution layer 16. In some embodiments, the impedance matchable circuit 19 may be a portion of the circuit layer 162. In some embodiments, the impedance matchable circuit 19 may be in a spiral shape from a top view.

To reduce the skin effect that may cause a current at high frequencies to flow mainly at a surface of a conductor (e.g., a circuit layer), a thickness of each of the circuit layers 162 may be greater than or equal to about 8 μm, or greater than or equal to about 10 μm. That is, a thickness of the second dielectric layer 142 may be greater than 8 μm to cover the circuit layer 162. In some embodiments, the thickness of the second dielectric layer 142 may be greater than or equal to about 10 μm, greater than or equal to about 12 μm, or greater than or equal to about 14 μm. In some embodiments, the thickness of the second dielectric layer 142 may be between about 10 μm and about 14 μm.

The impedance matching device (including, for example, the transformer 30) is disposed on and electrically connected to the redistribution structure 10. In some embodiments, the impedance matching device (including, for example, the transformer 30) may be spaced apart from the circuitless region 15 by the first electrical contact (including, for example, the electrical contact 94 and the electrical contact 94a).

In some embodiments, the impedance matching device (including, for example, the transformer 30) may include a base 31, at least one impedance matching circuit (including, for example, a first impedance matching circuit 32 and a second impedance matching circuit 33), a plurality of connection pads (including, for example, a first connection pad 34, a second connection pad 35 and a third connection pad 36), at least one conductive via 37 and at least one protection layer (including, for example, a first protection layer 38 and a second protection layer 39). A material of the base 31 may be, for example, FR4, polypropylene (PP) or bismaleimide-triazine (BT). The base 31 has a top surface 311 and a bottom surface 312 opposite to the top surface 311.

The first impedance matching circuit 32 may be, for example, a coil structure. The first impedance matching circuit 32 may be disposed adjacent to the bottom surface 312 of the base 31 and aligned with the circuitless region 15 of the redistribution structure 10. In some embodiments, the first impedance matching circuit 32 may be spaced apart from the circuitless region 15 of the redistribution structure 10 by the first electrical contact (including, for example, the electrical contact 94 and the electrical contact 94a). Further, the first electrical contact (including, for example, the electrical contact 94 and the electrical contact 94a) may not overlap with the first impedance matching circuit 32. That is, a projection area of the first electrical contact (including, for example, the electrical contact 94 and the electrical contact 94a) may not overlap with a projection area of the first impedance matching circuit 32. Thus, the first impedance matching circuit 32 and the circuitless region 15 of the redistribution structure 10 may constitute a portion of an inductor. In some embodiments, a projection area of the first impedance matching circuit 32 may fall within the circuitless region 15 of the redistribution structure 10. In some embodiments, a thickness of the first impedance matching circuit 32 may be greater than a thickness of the circuit layer 162. In some embodiments, the thickness of the first impedance matching circuit 32 may be greater than 10 μm, 15 μm, or 20 μm.

The second impedance matching circuit 33 may be, for example, a coil structure. The second impedance matching circuit 33 may be disposed adjacent to the top surface 311 of the base 31 and aligned with the circuitless region 15 of the redistribution structure 10. In some embodiments, the second impedance matching circuit 33 may be spaced apart from the circuitless region 15 of the redistribution structure 10 by the first electrical contact (including, for example, the electrical contact 94 and the electrical contact 94a). Further, the first electrical contact (including, for example, the electrical contact 94 and the electrical contact 94a) may not overlap with the second impedance matching circuit 33. That is, a projection area of the first electrical contact (including, for example, the electrical contact 94 and the electrical contact 94a) may not overlap with a projection area of the second impedance matching circuit 33. Thus, the second impedance matching circuit 33 and the circuitless region 15 of the redistribution structure 10 may constitute a portion of an inductor. In some embodiments, a projection area of the second impedance matching circuit 33 may fall within the circuitless region 15 of the redistribution structure 10. In some embodiments, a thickness of the second impedance matching circuit 33 may be greater than the thickness of the circuit layer 162. In some embodiments, the thickness of the second impedance matching circuit 33 may be greater than 10 μm, 15 μm, or 20 μm.

The first connection pad 34 and the second connection pad 35 may be disposed adjacent to the bottom surface 312 of the base 31 and spaced apart from each other. The first connection pad 34 may be bonded to one of the exposed portions of the topmost circuit layer 162 of the redistribution layer 16 through the first electrical contact 94a. The second connection pad 35 may be connected to the first impedance matching circuit 32 and bonded to one of the exposed portions of the topmost circuit layer 162 of the redistribution layer 16 through the first electrical contact 94. Thus, the first impedance matching circuit 32, the second connection pad 35 and the first electrical contact 94 may constitute a first electrical path P1 of the impedance matching device (including, for example, the transformer 30).

The third connection pad 36 may be disposed adjacent to the top surface 311 of the base 31 and connected to the second impedance matching circuit 33. The conductive via 37 may extend through the base 31 and disposed between the third connection pad 36 and the first connection pad 34 to electrically connect the third connection pad 36 and the first connection pad 34. Thus, the second impedance matching circuit 33, the third connection pad 36, the conductive via 37, the first connection pad 34 and the first electrical contact 94a may constitute a second electrical path P2 of the impedance matching device (including, for example, the transformer 30).

The first protection layer 38 may be, for example, a solder mask. The first protection layer 38 may be disposed on the bottom surface 312 of the base 31 to cover the first impedance matching circuit 32, the first connection pad 34 and the second connection pad 35. In some embodiments, a portion of the first protection layer 38 may be between the first impedance matching circuit 32 and the circuitless region 15 of the redistribution structure 10. Thus, the first impedance matching circuit 32, the portion of the first protection layer 38 and the circuitless region 15 may constitute a portion of an inductor. In some embodiments, the thickness t1 of the circuitless region 15 may be greater than a thickness t3 of the first protection layer 38.

The second protection layer 39 may be, for example, a solder mask. The second protection layer 39 may be disposed on the top surface 311 of the base 31 to cover the second impedance matching circuit 33 and the third connection pad 36.

The semiconductor device 21 may be, for example, a power amplifier. In some embodiments, the semiconductor device 21 may be disposed on the redistribution structure 10 and electrically connected to the impedance matchable circuit 19 of the redistribution structure 10. Further, the semiconductor device 21 may be electrically connected to the impedance matching device (including, for example, the transformer 30) through the impedance matchable circuit 19 of the redistribution structure 10. Thus, the impedance matchable circuit 19 of the redistribution structure 10 may fine tune the circuit impedance after coarse tuning by the impedance matching device (including, for example, the transformer 30). The semiconductor device 21 has a lower surface 212 and includes a plurality of bonding pads 214. The bonding pads 214 may be disposed adjacent to the lower surface 212 and bonded to some of the expose portions of the topmost circuit layer 162 of the redistribution layer 16 through the second electrical contacts 95 (e.g., solder balls) that may be disposed between the bonding pads 214 of the semiconductor device 21 and the expose portions of the topmost circuit layer 162 of the redistribution layer 16.

The encapsulant 41 is disposed on the redistribution structure 10 to encapsulate the semiconductor device 21 and the impedance matching device (including, for example, the transformer 30). A material of the encapsulant 41 may be a molding compound with or without fillers. In some embodiments, a portion of the encapsulant 41 may be disposed between the first impedance matching circuit 32 and the circuitless region 15 of the redistribution structure 10, and further there are no bonding materials (e.g., solder balls or solder bumps) being disposed in such portion of the encapsulant 41. The encapsulant 41 has a top surface 411, a bottom surface 412 opposite to the top surface 411 and a peripheral surface 413 extending between the top surface 411 and the bottom surface 412. In some embodiments, the peripheral surface 13 of the redistribution structure 10 may be substantially coplanar with the peripheral surface 413 of the encapsulant 41.

The shielding layer 91 covers the encapsulant 41 (e.g., the top surface 411 and the peripheral surface 413) and the peripheral surface 13 of the redistribution structure 10 to reduce radio frequency interferences. In some embodiments, the shielding layer 91 may be electrically connected to the redistribution structure 10.

The third electrical contacts 96 (e.g., solder balls) are mounted on the redistribution structure 10 for external connection. In some embodiments, the third electrical contacts 96 may be electrically connected to the inner vias 18 of the redistribution structure 10.

By reducing the thickness of the circuit layer 162, the thickness of the first dielectric layer 141 and the thickness of the second dielectric layer 142, the thickness of the redistribution structure 10 may be greatly reduced to lower than 150 μm. Thus, a whole thickness of the semiconductor package structure 1 may be further reduced to lower than 350 μm. In addition, the impedance matching device (including, for example, the transformer 30) may fine tune the circuit impedance for matching the semiconductor device 21 through adjusting the distance between the impedance matching circuit (including, for example, the first impedance matching circuit 32 and the second impedance matching circuit 33) and the circuitless region 15 of the redistribution structure 10, the thickness of the first dielectric layer 141 or the thickness of the second dielectric layer 142.

Figure 2:
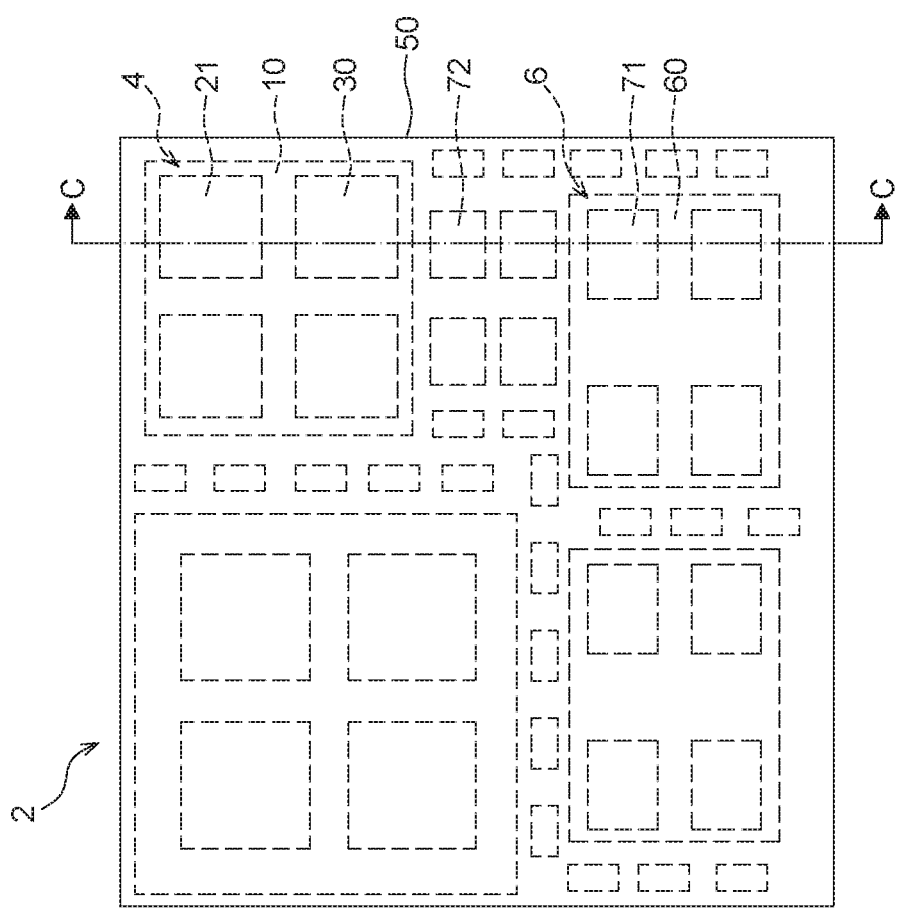
FIG. 2 illustrates a top view of a semiconductor package structure according to some embodiments of the present disclosure.
Figure 3:
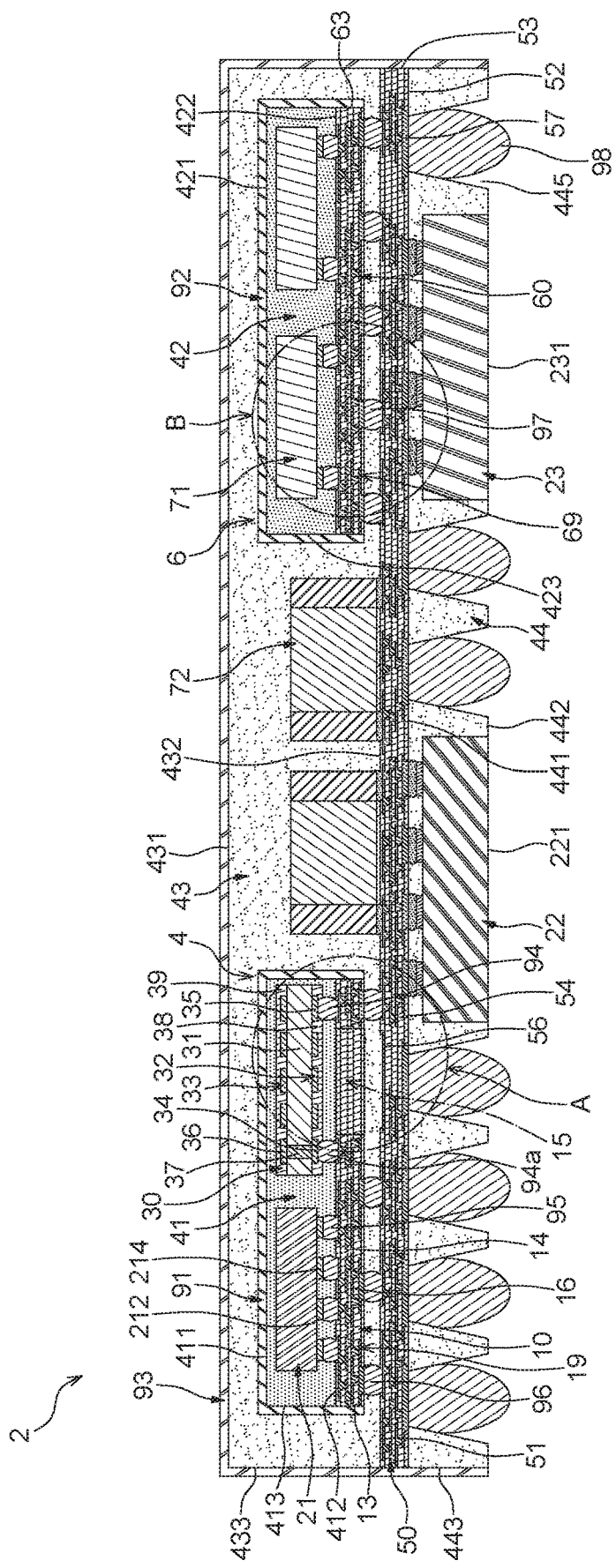
FIG. 3 illustrates a cross-sectional view along line C-C of FIG. 2.
Figure 4:
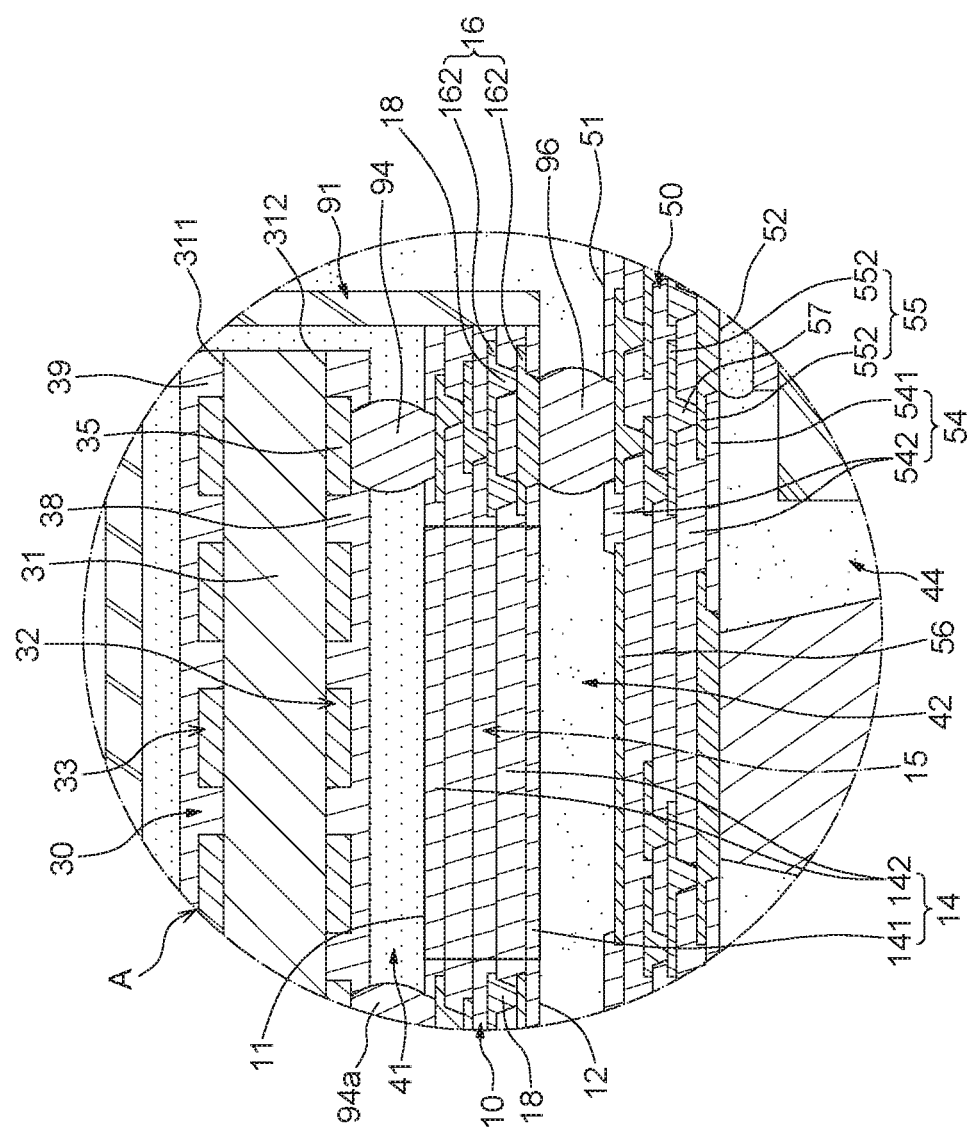
FIG. 4 illustrates an enlarged view of an area "A" of FIG. 3.

FIG. 2 illustrates a top view of a semiconductor package structure 2 according to some embodiments of the present disclosure. FIG. 3 illustrates a cross-sectional view along line C-C of FIG. 2. FIG. 4 illustrates an enlarged view of an area "A" of FIG. 3. The semiconductor package structure 2 includes a conductive structure 50, a lower resolution impedance-matchable device 4, a higher resolution impedance-matchable device 6, at least one impedance-matchable device 72, an encapsulant 43, at least one semiconductor device, an encapsulant 44, at least one electrical element 98 and a shielding cover 93. The lower resolution impedance-matchable device 4 may be also referred to as "a first impedance-matchable device". The higher resolution impedance-matchable device 6 may be also referred to as "a second impedance-matchable device". That is, a resolution of the first impedance-matchable device may be different from a resolution of the second impedance-matchable device.

Referring to FIG. 3 and FIG. 4, the conductive structure 50 may be, for example, a redistribution structure or a substrate. The conductive structure 50 has an upper surface 51, a lower surface 52 opposite to the upper surface 51 and a peripheral surface 53 extending between the upper surface 51 and the lower surface 52. In some embodiments, the conductive structure 50 may include a dielectric structure 54, a redistribution layer 55, a conductive layer 56 and a plurality of inner vias 57. The dielectric structure 54 may include a first dielectric layer 541 and at least one second dielectric layer 542. The second dielectric layer 542 may be disposed on a top surface of the first dielectric layer 541. The first dielectric layer 541 and the second dielectric layer 542 may be made of a cured photoimageable dielectric (PID) material such as epoxy or polyimide (PI) including photoinitiators. The redistribution layer 55 may be in contact with the dielectric structure 54 and may include a plurality of circuit layers 552. The circuit layer 552 may be a fan-out circuit layer, and a line width/line space (L/S) of the circuit layer 552 may be less than or equal to 2 μm/2 or less than or equal to 1.8 μm/1.8 μm. The conductive layer 56 may be in contact with the dielectric structure 54 and serves as a ground plane. In some embodiments, the conductive layer 56 may be exposed from the upper surface 51 of the conductive structure 50. In some embodiments, the conductive layer 56 may be a portion of the circuit layer 552 of the redistribution layer 55. The inner vias 57 may electrically connect at least one circuit layer 552 or two adjacent circuit layers 552 of the redistribution layer 55. Further, the inner vias 57 may taper toward the lower surface 52. As shown in FIG. 4, the topmost second dielectric layer 542 may cover the topmost circuit layer 552, and may define a plurality of openings to expose portions of the topmost circuit layer 552.

The lower resolution impedance-matchable device 4 is disposed on and electrically connected to the conductive structure 50. In some embodiments, the lower resolution impedance-matchable device 4 may be the semiconductor package structure 1 of FIG. 1, and may include the redistribution structure 10, a first electronic component (including, for example, an impedance matching device such as the transformer 30), a second electronic component (including, for example, the semiconductor device 21 such as a power amplifier), the first encapsulant 41 and the first shielding layer 91. An accuracy of the lower resolution impedance-matchable device 4 to tune the circuit impedance of the semiconductor package structure 2 may be greater than or equal to a range of ±5%, or ±10%.

In some embodiments, the redistribution structure 10 of FIG. 3 and FIG. 4 may be the same as the redistribution structure 10 of FIG. 1. Further, the redistribution structure 10 of FIG. 3 and FIG. 4 may be electrically connected to the conductive structure 50 through a plurality of electrical contacts 96 (e.g., solder balls). That is, the impedance matchable circuit 19 of the redistribution structure 10 may be spaced apart from the conductive layer 56 (e.g., the ground plane) by the electrical contacts 96. In some embodiments, the electrical contacts 96 may not overlap with the impedance matchable circuit 19 of the redistribution structure 10. That is, a projection area of the electrical contact 96 may not overlap with a projection area of the impedance matchable circuit 19 of the redistribution structure 10.

The first electronic component (including, for example, an impedance matching device such as the transformer 30) of FIG. 3 and FIG. 4 may be the same as the impedance matching device including the transformer 30 of FIG. 1. The second electronic component (including, for example, the semiconductor device 21 such as a power amplifier) of FIG. 3 and FIG. 4 may be the same as the semiconductor device 21 (such as a power amplifier) of FIG. 1. The first encapsulant 41 of FIG. 3 and FIG. 4 may be the same as the encapsulant 41 of FIG. 1. The first shielding layer 91 of FIG. 3 and FIG. 4 may be the same as the shielding layer 91 of FIG. 1.

The first shielding layer 91 is disposed on the first encapsulant 41 to cover the first encapsulant 41 (e.g., the top surface 411 and the peripheral surface 413) and the peripheral surface 13 of the redistribution structure 10 to reduce radio frequency interferences. In some embodiments, the first shielding layer 91 may be electrically connected to the redistribution structure 10.

The higher resolution impedance-matchable device 6 is disposed on and electrically connected to the conductive structure 50. In some embodiments, the higher resolution impedance-matchable device 6 may include a redistribution structure 60, an impedance-matching circuit, at least one electronic component 71, a second encapsulant 42 and a second shielding layer 92. An accuracy of the higher resolution impedance-matchable device 6 to tune the circuit impedance of the semiconductor package structure 2 may be less than or equal to a range of ±2%, or ±1%.

Figure 5:
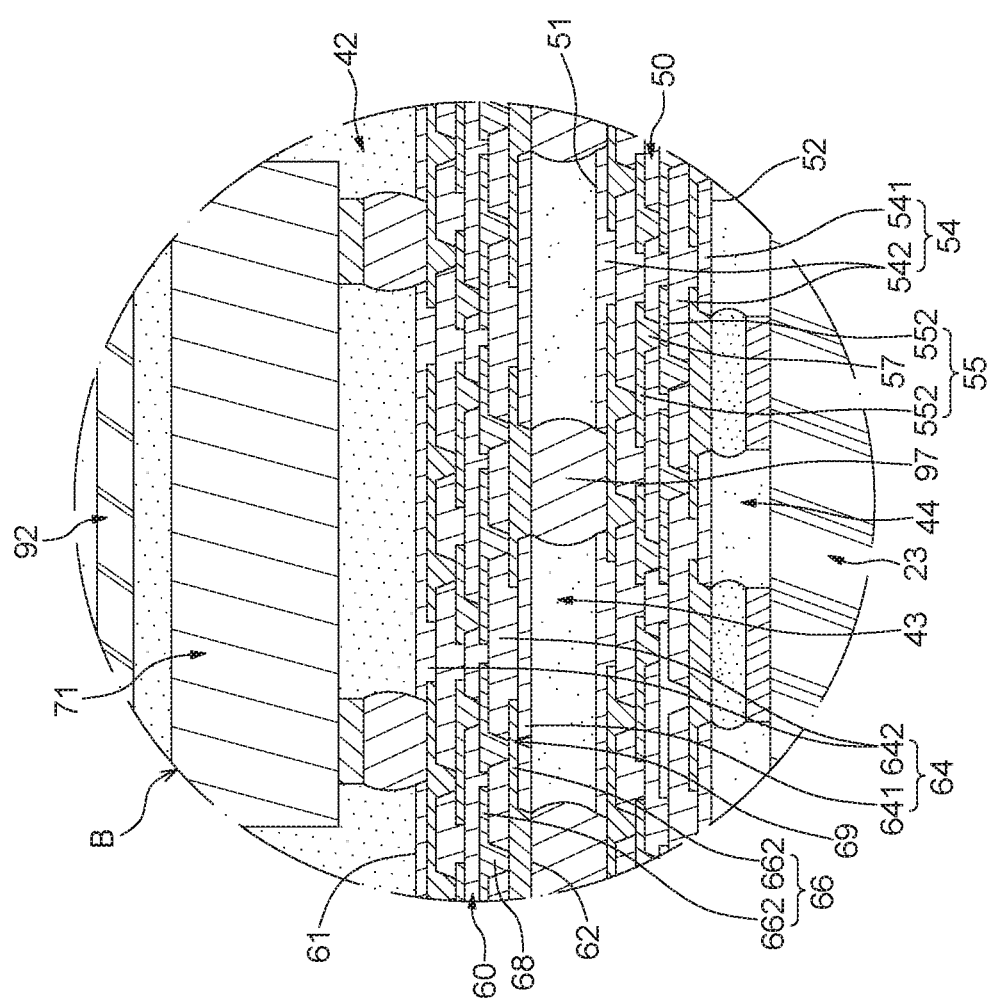
FIG. 5 illustrates an enlarged view of an area "B" of FIG. 3.

FIG. 5 illustrates an enlarged view of an area "B" of FIG. 3. Referring to FIG. 3 and FIG. 5, the redistribution structure 60 is disposed adjacent to the upper surface 51 of the conductive structure 50 and electrically connected to the conductive structure 50 through a plurality of electrical contacts 97 that may be mounted on the redistribution structure 60. The redistribution structure 60 has an upper surface 61, a lower surface 62 opposite to the upper surface 61 and a peripheral surface 63 extending between the upper surface 61 and the lower surface 62. In some embodiments, the redistribution structure 60 may include a dielectric structure 64, a redistribution layer 66, a plurality of inner vias 68 and an impedance matchable circuit 69. The dielectric structure 64 may include a first dielectric layer 641 and at least one second dielectric layer 642. The second dielectric layer 642 may be disposed on a top surface of the first dielectric layer 641. The first dielectric layer 641 and the second dielectric layer 642 may be made of a cured photo-imageable dielectric (PID) material such as epoxy or polyimide (PI) including photoinitiators. The redistribution layer 66 may be embedded in the dielectric structure 64 and may include a plurality of circuit layers 662. The circuit layer 662 may be a fan-out circuit layer, and a line width/line space (L/S) of the circuit layer 662 may be less than or equal to 2 μm/2 μm, or less than or equal to 1.8 μm/1.8 μm. A material of the circuit layer 662 may be, for example, copper. The inner vias 68 may electrically connect at least one circuit layer 662 or two adjacent circuit layers 662 of the redistribution layer 66. Further, the inner vias 68 may taper toward the lower surface 62. As shown in FIG. 5, the topmost second dielectric layer 642 may cover the topmost circuit layer 662, and may define a plurality of openings to expose portions of the topmost circuit layer 662. The impedance matchable circuit 69 may be electrically connected to the circuit layer 662 of the redistribution layer 66. In some embodiments, the impedance matchable circuit 69 may be a portion of the circuit layer 662. In some embodiments, the impedance matchable circuit 69 may be in a spiral shape from a top view. Further, the impedance matchable circuit 69 may be spaced apart from the ground plane (e.g., the conductive layer 56) by the electrical contacts 97. In some embodiments, the electrical contacts 97 may not overlap with the impedance matchable circuit 69 of the redistribution structure 60. That is, a projection area of the electrical contact 97 may not overlap with a projection area of the impedance matchable circuit 69 of the redistribution structure 60.

To reduce the skin effect, a thickness of each of the circuit layers 662 may be greater than or equal to about 8 μm. That is, a thickness of the second dielectric layer 642 may be greater than 8 μm to cover the circuit layer 662. In some embodiments, the thickness of the second dielectric layer 642 may be greater than or equal to about 10 μm. In some embodiments, the thickness of the second dielectric layer 642 may be between about 10 μm and about 14 μm.

In some embodiments, the circuit layers 662 of the redistribution layer 66 may be the impedance-matching circuit. That is, the impedance-matching circuit may be disposed in the redistribution structure 60.

The electronic component 71 is disposed on and electrically connected to the redistribution structure 60 through, for example, solder balls or solder bumps. In some embodiments, the electronic component 71 may be electrically connected to the impedance matchable circuit 69 of the redistribution structure 60. Thus, the impedance matchable circuit 69 of the redistribution structure 60 may fine tune the circuit impedance after tuning by the electronic component 71. In some embodiments, the electronic component 71 may include a filter. The filter may be, for example, a surface acoustic wave (SAW) filter or a bulk acoustic wave (BAW) filter.

The second encapsulant 42 is disposed on the redistribution structure 60 to encapsulate the redistribution structure 60 and the electronic component 71. A material of the second encapsulant 42 may be a molding compound with or without fillers. The second encapsulant 42 has a top surface 421, a bottom surface 422 opposite to the top surface 421 and a peripheral surface 423 extending between the top surface 421 and the bottom surface 422. In some embodiments, the peripheral surface 63 of the redistribution structure 60 may be substantially coplanar with the peripheral surface 423 of the second encapsulant 42.

The second shielding layer 92 is disposed on the second encapsulant 42 to cover the second encapsulant 42 (e.g., the top surface 421 and the peripheral surface 423) and the peripheral surface 63 of the redistribution structure 60 to reduce radio frequency interferences. In some embodiments, the second shielding layer 92 may be electrically connected to the redistribution structure 60.

The impedance-matchable device 72 may be, for example, an inductor, a resistor or a capacitor. The impedance-matchable device 72 may be disposed on and electrically connected to the conductive structure 50. In some embodiments, a resolution of the impedance-matchable device 72 may be between the lower resolution impedance-matchable device 4 and the higher resolution impedance-matchable device 6.

The encapsulant 43 is disposed on the conductive structure 50 to encapsulate the lower resolution impedance-matchable device 4, the higher resolution impedance-matchable device 6 and the impedance-matchable device 72. That is, the first shielding layer 91 may be disposed between the first encapsulant 41 and the encapsulant 43, and the second shielding layer 92 may be disposed between the second encapsulant 42 and the encapsulant 43. Further, a portion of the encapsulant 43 may be disposed between the conductive layer 56 and the circuitless region 15 of the redistribution structure 10. A material of the encapsulant 43 may be a molding compound with or without fillers. The encapsulant 43 has a top surface 431, a bottom surface 432 opposite to the top surface 431 and a peripheral surface 433 extending between the top surface 431 and the bottom surface 432. In some embodiments, the peripheral surface 53 of the conductive structure 50 may be substantially coplanar with the peripheral surface 433 of the encapsulant 43.

The semiconductor device (including, for example, a semiconductor device 22 and a semiconductor device 23) may be, for example, a controller, a low-noise amplifier or a switch. The controller may include mobile industry processor interface (MIPI) or general purpose input output (GPIO). In some embodiments, the semiconductor device (including, for example, the semiconductor device 22 and the semiconductor device 23) may be disposed on the lower surface 52 of the conductive structure 50 and electrically connected to the conductive structure 50. The semiconductor device (including, for example, the semiconductor device 22 and the semiconductor device 23) has a bottom surface (including, for example, a bottom surface 221 and a bottom surface 231).

The encapsulant 44 is disposed on the lower surface 52 of the conductive structure 50 to encapsulate the semiconductor device (including, for example, the semiconductor device 22 and the semiconductor device 23). A material of the encapsulant 44 may be a molding compound with or without fillers. The encapsulant 44 has a top surface 441, a bottom surface 442 opposite to the top surface 441 and a peripheral surface 443 extending between the top surface 441 and the bottom surface 442. In addition, the encapsulant 44 may define at least one opening 445 extending through the encapsulant 44 to expose a portion (e.g., a portion of the inner via 57) of the conductive structure 50. In some embodiments, the bottom surface (including, for example, the bottom surface 221 and the bottom surface 231) of the semiconductor device (including, for example, the semiconductor device 22 and the semiconductor device 23) may be substantially coplanar with the bottom surface 442 of the encapsulant 44. Further, the peripheral surface 53 of the conductive structure 50 may be substantially coplanar with the peripheral surface 443 of the encapsulant 44.

The electrical element 98 (e.g., solder ball) is disposed on the lower surface 52 of the conductive structure 50. In some embodiments, the electrical element 98 may be disposed in the opening 445 of the encapsulant 44 and on the exposed portion (e.g., the exposed of the inner via 57) of the conductive structure 50 for external connection. In some embodiments, the encapsulant 44 may encapsulate an upper portion of the electrical element 98, and a lower portion of the electrical element 98 may protrude downward from the bottom surface 442 of the encapsulant 44.

The shielding cover 93 is disposed on the encapsulant 43 to cover the encapsulant 43 (e.g., the top surface 431 and the peripheral surface 433), the peripheral surface 53 of the conductive structure 50 and the peripheral surface 443 of the encapsulant 44 to reduce radio frequency interferences. In some embodiments, the shielding cover 93 may be electrically connected to the conductive structure 50.

By reducing the thickness of the lower resolution impedance-matchable device 4, the thickness of the higher resolution impedance-matchable device 6 and the thickness of the conductive structure 50, a whole thickness of the semiconductor package structure 2 may be greatly reduced to lower than 600 μm. In addition, the lower resolution impedance-matchable device 4 and the higher resolution impedance-matchable device 6 may fine tune or coarse tune the circuit impedance of the semiconductor package structure 2 to improve the electrical performance of the semiconductor package structure 2.

Figure 6:
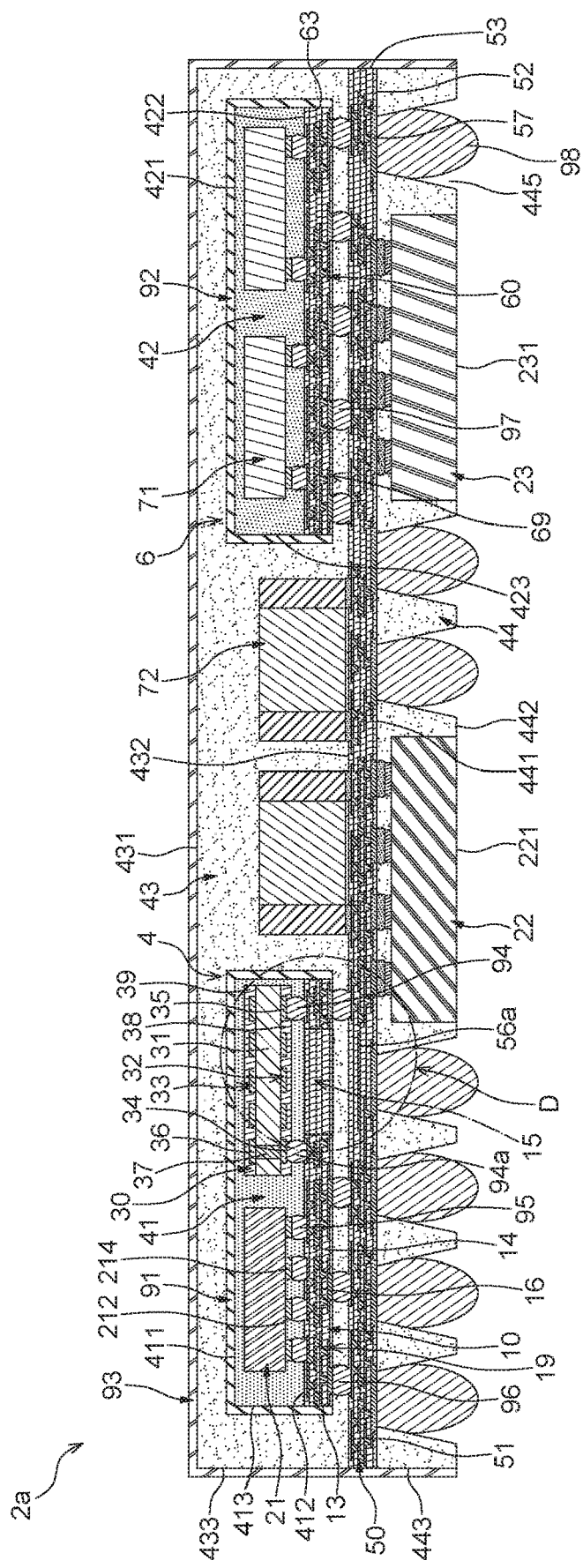
FIG. 6 illustrates a cross-sectional view of a semiconductor package structure according to some embodiments of the present disclosure.
Figure 7:
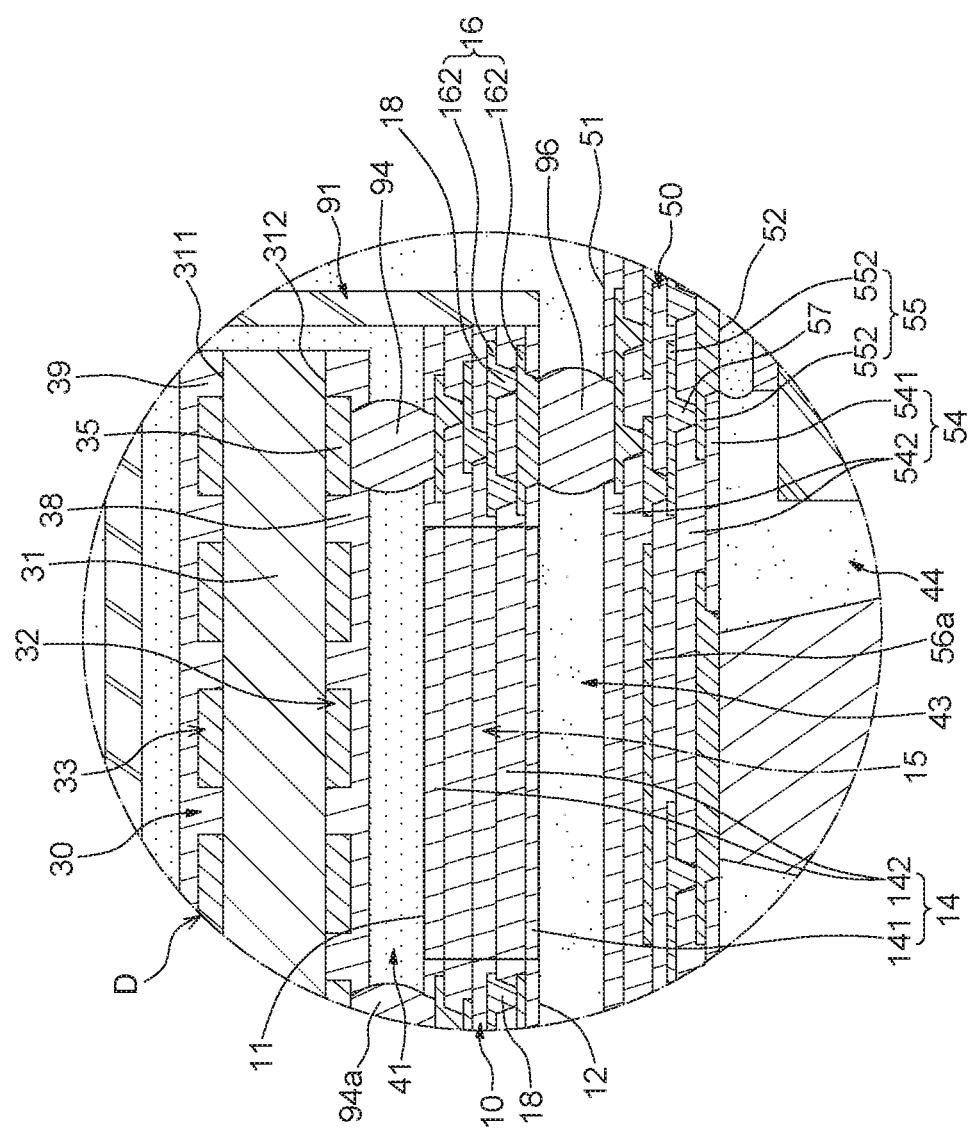
FIG. 7 illustrates an enlarged view of an area "D" of FIG. 6.

FIG. 6 illustrates a cross-sectional view of a semiconductor package structure 2a according to some embodiments of the present disclosure. FIG. 7 illustrates an enlarged view of an area "D" of FIG. 6. The semiconductor package structure 2a is similar to the semiconductor package structure 2 shown in FIG. 2 through FIG. 5, except for the configuration of the conductive layer 56a. The conductive layer 56a may be embedded in the dielectric structure 54 of the conductive structure 50. Thus, the distance between the conductive layer 56a and the circuitless region 15 of the redistribution structure 10 may correspondingly increase to adjust the inductance value of the inductor and fine tune impedance matching. As shown in FIG. 7, a portion (e.g., the second dielectric layer 542) of the dielectric structure 54 of the conductive structure 50 may be between the conductive layer 56a and the circuitless region 15 of the redistribution structure 10 to adjust the dielectric constant between the impedance matching component 30 and the conductive layer 56a.

Figure 8:
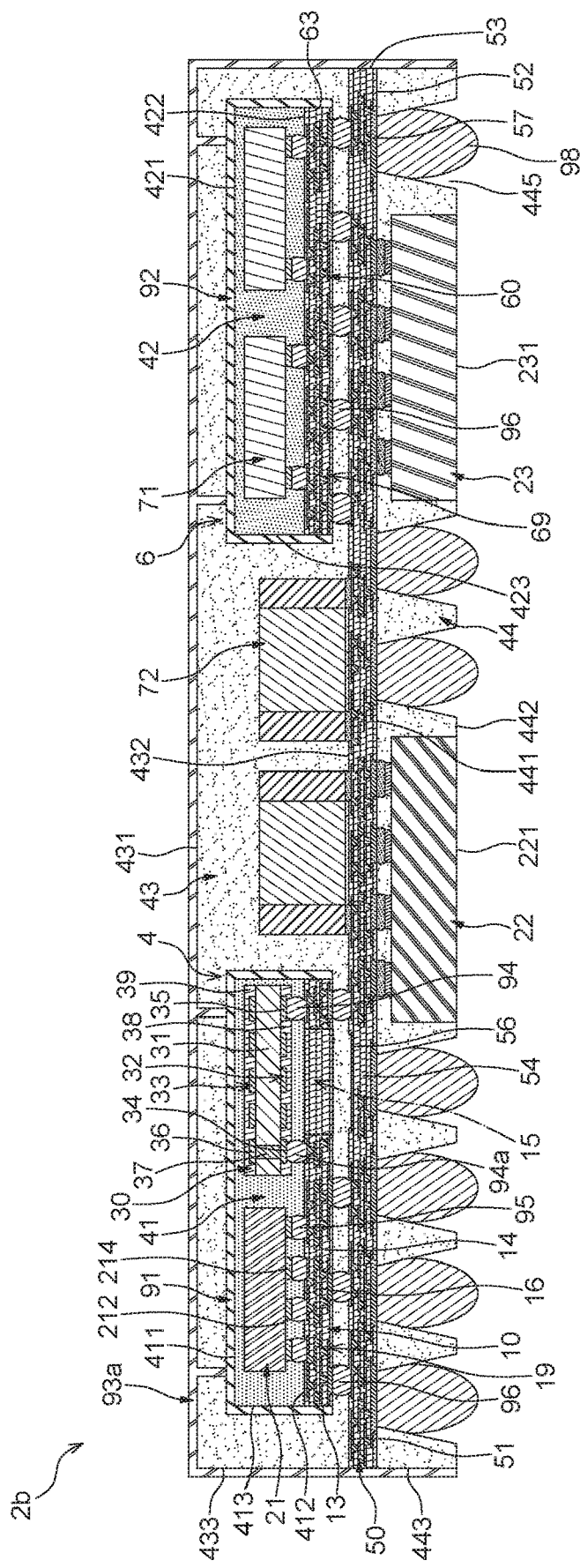
FIG. 8 illustrates a cross-sectional view of a semiconductor package structure according to some embodiments of the present disclosure.

FIG. 8 illustrates a cross-sectional view of a semiconductor package structure 2b according to some embodiments of the present disclosure. The semiconductor package structure 2b is similar to the semiconductor package structure 2 shown in FIG. 3, except for the configuration of the shielding cover 93a. A portion of the shielding cover 93a may extend into the encapsulant 43 to connect the first shielding layer 91. Thus, the heat generated by the second electronic component (including, for example, the semiconductor device 21 such as a power amplifier) during operation may easy to dissipate through the first shielding layer 91 and the shielding cover 93a.

Figure 9:
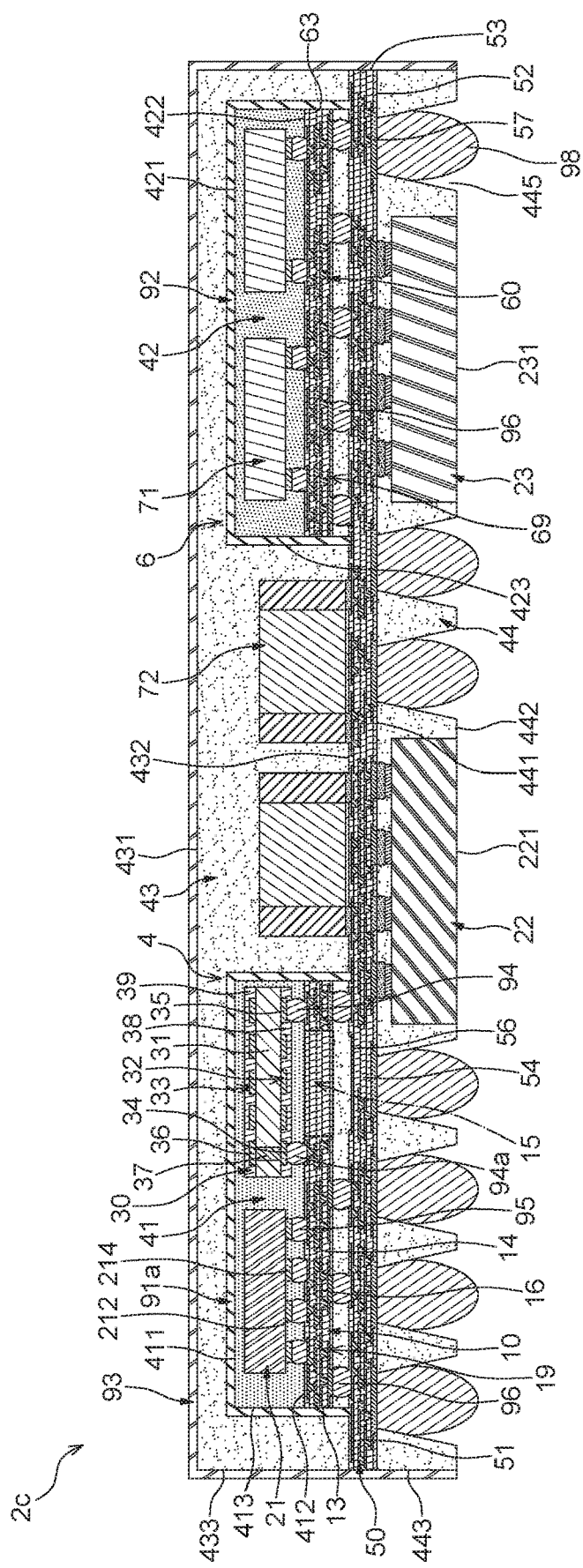
FIG. 9 illustrates a cross-sectional view of a semiconductor package structure according to some embodiments of the present disclosure.

FIG. 9 illustrates a cross-sectional view of a semiconductor package structure 2c according to some embodiments of the present disclosure. The semiconductor package structure 2c is similar to the semiconductor package structure 2 shown in FIG. 3, except for the configuration of the first shielding layer 91a. The first shielding layer 91a may extend downward to connect the conductive structure 50. Thus, the heat generated by the second electronic component (including, for example, the semiconductor device 21 such as a power amplifier) during operation may easy to dissipate through the shielding layer 91a and the conductive structure 50.

Figure 10:
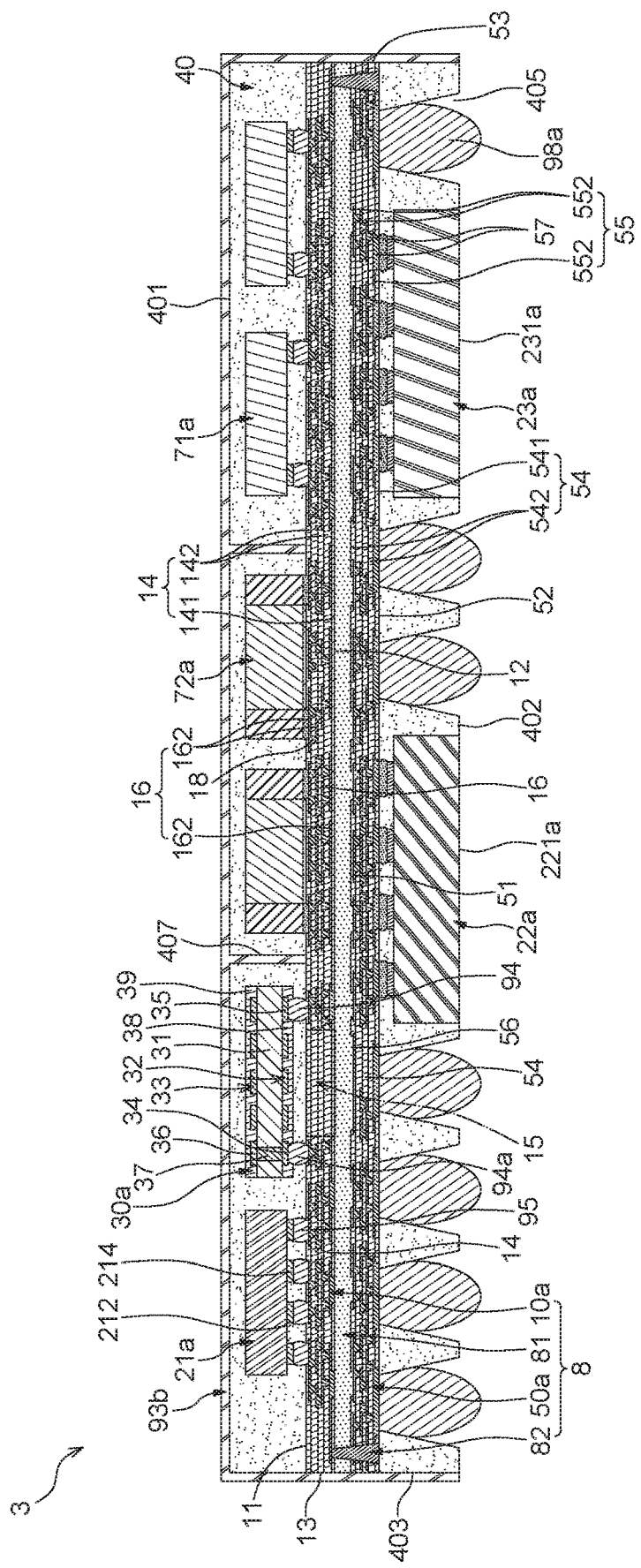
FIG. 10 illustrates a cross-sectional view of a semiconductor package structure according to some embodiments of the present disclosure.

FIG. 10 illustrates a cross-sectional view of a semiconductor package structure 3 according to some embodiments of the present disclosure. The semiconductor package structure 3 includes a conductive structure 8, an impedance matching device, at least one first semiconductor device 21*a*, at least one electronic component 71*a*, at least one impedance-matchable device 72*a*, at least one second semiconductor device, an encapsulant 40, at least one electrical element 98*a* and a shielding cover 93*b*. In some embodiments, the conductive structure 8 may include a first circuit portion 50*a*, a second circuit portion 10*a*, an adhesive layer 81 and at least one conductive via 82.

The first circuit portion 50*a* of FIG. 10 may be the same as the conductive structure 50 of FIG. 3 and FIG. 4.

The second circuit portion 10*a* is bonded to the first circuit portion 50*a* through the adhesive layer 81 that may be disposed between the first circuit portion 50*a* and the second circuit portion 10*a*. In some embodiments, the second circuit portion 10*a* of FIG. 10 may be the same as the redistribution structure 10 of FIG. 3 and FIG. 4, except for the size of the second circuit portion 10*a* may be greater than the size of the redistribution structure 10 and substantially equal to the size of the first circuit portion 50*a*.

The conductive via 82 electrically connects the first circuit portion 50*a* to the second circuit portion 10*a* through the adhesive layer 81. In some embodiments, the conductive via 82 may extend through the first circuit portion 50*a* and the adhesive layer 81 to electrically connect the second circuit portion 10*a*. Further, the conductive via 82 may extend through a portion (e.g., the first dielectric layer 141) of the dielectric structure 14 to electrically connect or contact the bottommost circuit layer 162 of the redistribution layer 16.

The impedance matching device (including, for example, a transformer 30*a*) is disposed on and electrically connected to the second circuit portion 10*a*. In some embodiments, the impedance matching device (including, for example, the transformer 30*a*) of FIG. 10 may be the same as the impedance matching device (including, for example, the transformer 30) of FIG. 3 and FIG. 4.

The first semiconductor device 21*a* is disposed on the second circuit portion 10*a* and electrically connected to the impedance matching device (including, for example, the transformer 30*a*). That is, the first semiconductor device 21*a* may be electrically connected to the impedance matching device (including, for example, the transformer 30*a*) through the second circuit portion 10*a*. In some embodiments, the first semiconductor device 21*a* of FIG. 10 may be the same as the semiconductor device 21 (such as a power amplifier) of FIG. 3.

The electronic component 71*a* is disposed on and electrically connected to the second circuit portion 10*a* through, for example, solder balls or solder bumps. In some embodiments, the electronic component 71*a* may include a filter. The filter may be, for example, a surface acoustic wave (SAW) filter or a bulk acoustic wave (BAW) filter.

The impedance-matchable device 72*a* may be, for example, an inductor, a resistor or a capacitor. The impedance-matchable device 72*a* may be disposed on and electrically connected to the second circuit portion 10*a*.

The second semiconductor device (including, for example, a second semiconductor device 22*a* and a second semiconductor device 23*a*) may be, for example, a controller, a low-noise amplifier or a switch. The controller may include mobile industry processor interface (MIPI) or general purpose input output (GPIO). In some embodiments, the second semiconductor device (including, for example, the second semiconductor device 22*a* and the second semiconductor device 23*a*) may be disposed on the lower surface 52 of the first circuit portion 50*a* and electrically connected to the first circuit portion 50*a*. The second semiconductor device (including, for example, the second semiconductor device 22*a* and the second semiconductor device 23*a*) has a bottom surface (including, for example, a bottom surface 221*a* and a bottom surface 231*a*).

The encapsulant 40 encapsulates the first circuit portion 50*a*, the second circuit portion 10*a*, the impedance matching device (including, for example, the transformer 30*a*), the first semiconductor device 21*a*, the electronic component 71*a*, the impedance-matchable device 72*a* and the second semiconductor device (including, for example, the second semiconductor device 22*a* and the second semiconductor device 23*a*). A material of the encapsulant 40 may be a molding compound with or without fillers. The encapsulant 40 may include a lower portion below the first circuit portion 50*a* and an upper portion above the second circuit portion 10*a*. The encapsulant 40 may define at least one opening 405 extending through the lower portion of the encapsulant 40 to expose a portion (e.g., a portion of the inner via 57) of the first circuit portion 50*a*. Further, the encapsulant 40 may define at least one through hole 407 extending through the upper portion of the encapsulant 40 to expose a portion (e.g., a portion of the first surface 11) of the second circuit portion 10*a*. In some embodiments, the bottom surface (including, for example, the bottom surface 221*a* and the bottom surface 231*a*) of the second semiconductor device (including, for example, the second semiconductor device 22*a* and the second semiconductor device 23*a*) may be substantially coplanar with a bottom surface 402 of the encapsulant 40. Further, the peripheral surface 53 of the first circuit portion 50*a* may be substantially coplanar with a peripheral surface 403 of the encapsulant 40.

The electrical element 98*a* (e.g., solder ball) is disposed on the lower surface 52 of the first circuit portion 50*a*. In some embodiments, the electrical element 98*a* may be disposed in the opening 405 of the encapsulant 40 and on the exposed portion (e.g., the exposed portion of the inner via 57) of the first circuit portion 50*a* for external connection. In some embodiments, the encapsulant 40 may encapsulate an upper portion of the electrical element 98*a*, and a lower portion of the electrical element 98*a* may protrude downward from the bottom surface 402 of the encapsulant 40.

The shielding cover 93*b* is disposed on the encapsulant 40 to cover the encapsulant 40 (e.g., a top surface 401 and the peripheral surface 403), the peripheral surface 53 of the first circuit portion 50*a*, the peripheral surface 13 of the second circuit portion 10*a* and a peripheral surface of the adhesive layer 81 to reduce radio frequency interferences. In some embodiments, the shielding cover 93*b* may be electrically connected to the first circuit portion 50*a*. Further, a portion of the shielding cover 93*b* may extend into the through hole 407 of the encapsulant 40 to contact the exposed portion (e.g., the exposed portion of the first surface 11) of the second circuit portion 10*a*.

Figure 11:
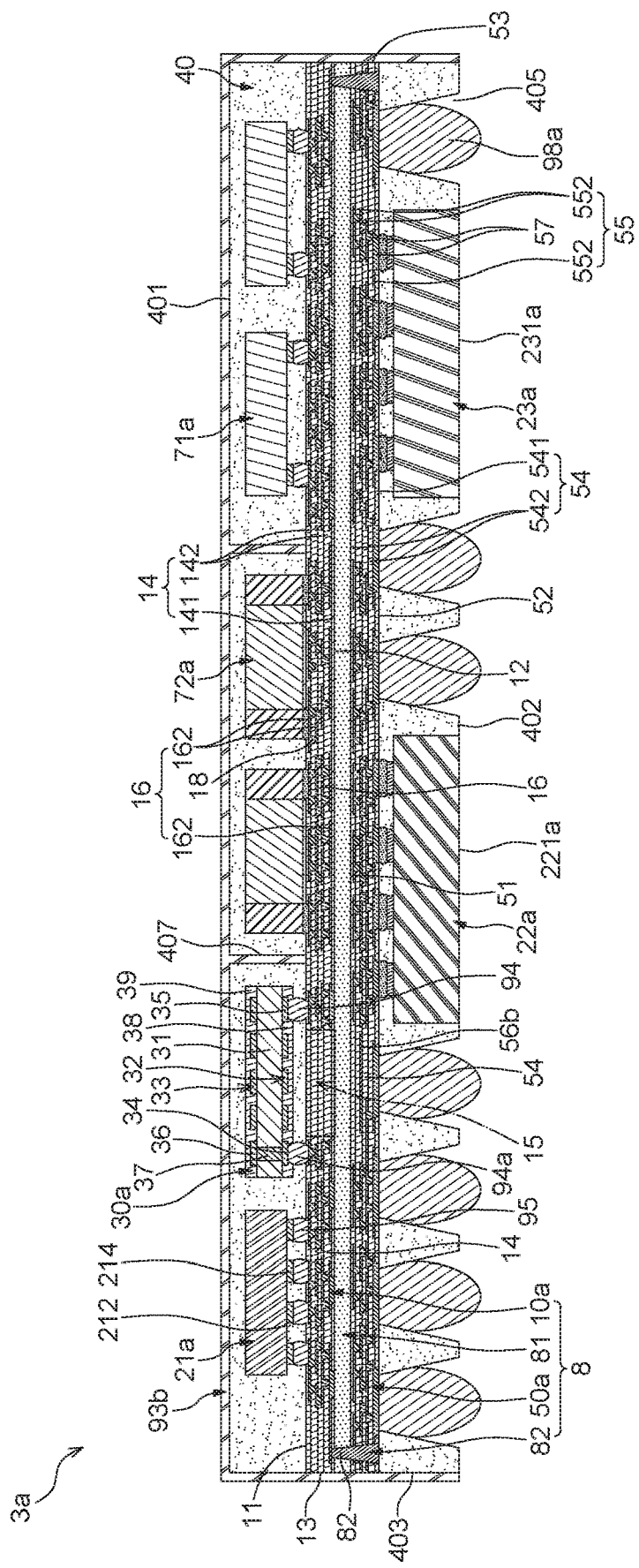
FIG. 11 illustrates a cross-sectional view of a semiconductor package structure according to some embodiments of the present disclosure.

FIG. 11 illustrates a cross-sectional view of a semiconductor package structure 3*a* according to some embodiments of the present disclosure. The semiconductor package structure 3*a* is similar to the semiconductor package structure 3 shown in FIG. 10, except for the configuration of the conductive layer 56*b*. The conductive layer 56*b* may be embedded in the dielectric structure 54 of the first circuit portion 50*a*. Thus, the distance between the conductive layer 56*b* and the circuitless region 15 of the second circuit portion 10*a* may correspondingly increase to adjust the inductance value of the inductor and fine tune impedance matching. As shown in FIG. 11, a portion (e.g., the second dielectric layer 542) of the dielectric structure 54 of the first circuit portion 50a may be between the conductive layer 56b and the circuitless region 15 of the second circuit portion 10a to adjust the dielectric constant between the impedance matching device (including, for example, the transformer 30a) and the conductive layer 56b.

FIG. 12 through FIG. 16 illustrate a method for manufacturing a semiconductor package structure according to some embodiments of the present disclosure. In some embodiments, the method is for manufacturing a semiconductor package structure such as the semiconductor package structure 1 shown in FIG. 1.

Figure 12:
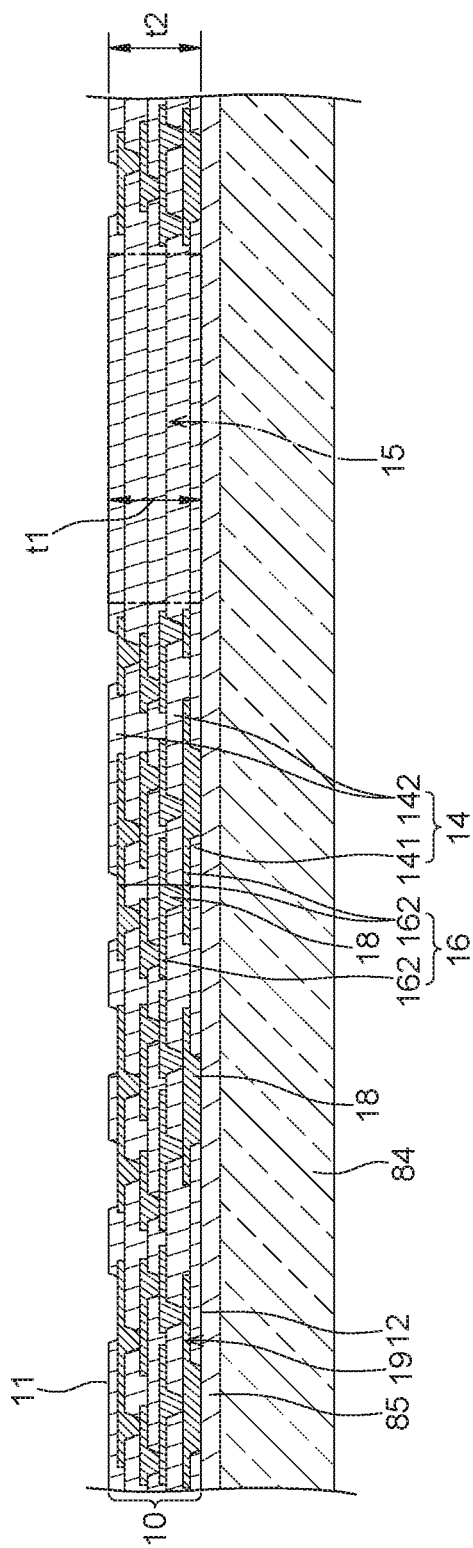
FIG. 12 illustrates one or more stages of an example of a method for manufacturing a semiconductor package structure according to some embodiments of the present disclosure.

Referring to FIG. 12, a redistribution structure 10 is provided. The first semiconductor die 10 is attached to a release layer 85 that is formed or disposed on a carrier 84.

The redistribution structure 10 includes a first surface 11, a second surface 12 opposite to the first surface 11, a dielectric structure 14, a circuitless region 15, a redistribution layer 16 and a plurality of inner vias 18. The dielectric structure 14 may include a first dielectric layer 141 and at least one second dielectric layer 142. The second dielectric layer 142 may be disposed on a top surface of the first dielectric layer 141.

The circuitless region 15 may extend from the first surface 11 (e.g., a top surface of the dielectric structure 14) to the second surface 12 (e.g., a bottom surface of the dielectric structure 14). That is, a thickness t1 of the circuitless region 15 is substantially equal to a thickness t2 of the redistribution structure 10 from the first surface 11 to the second surface 12. In some embodiments, the circuitless region 15 may include a portion of the first dielectric layer 141 and a portion of the second dielectric layer 142. The redistribution layer 16 may be embedded in the dielectric structure 14 and may include a plurality of circuit layers 162. The redistribution layer 16 may be disposed outside the circuitless region 15. That is, the circuit layers 162 may not extend into the circuitless region 15. The inner vias 18 may electrically connect at least one circuit layer 162 or two adjacent circuit layers 162 of the redistribution layer 16. Further, the inner vias 18 may taper toward the second surface 12. As shown in FIG. 12, the topmost second dielectric layer 142 may cover the topmost circuit layer 162, and may define a plurality of openings to expose portions of the topmost circuit layer 162.

Figure 13:
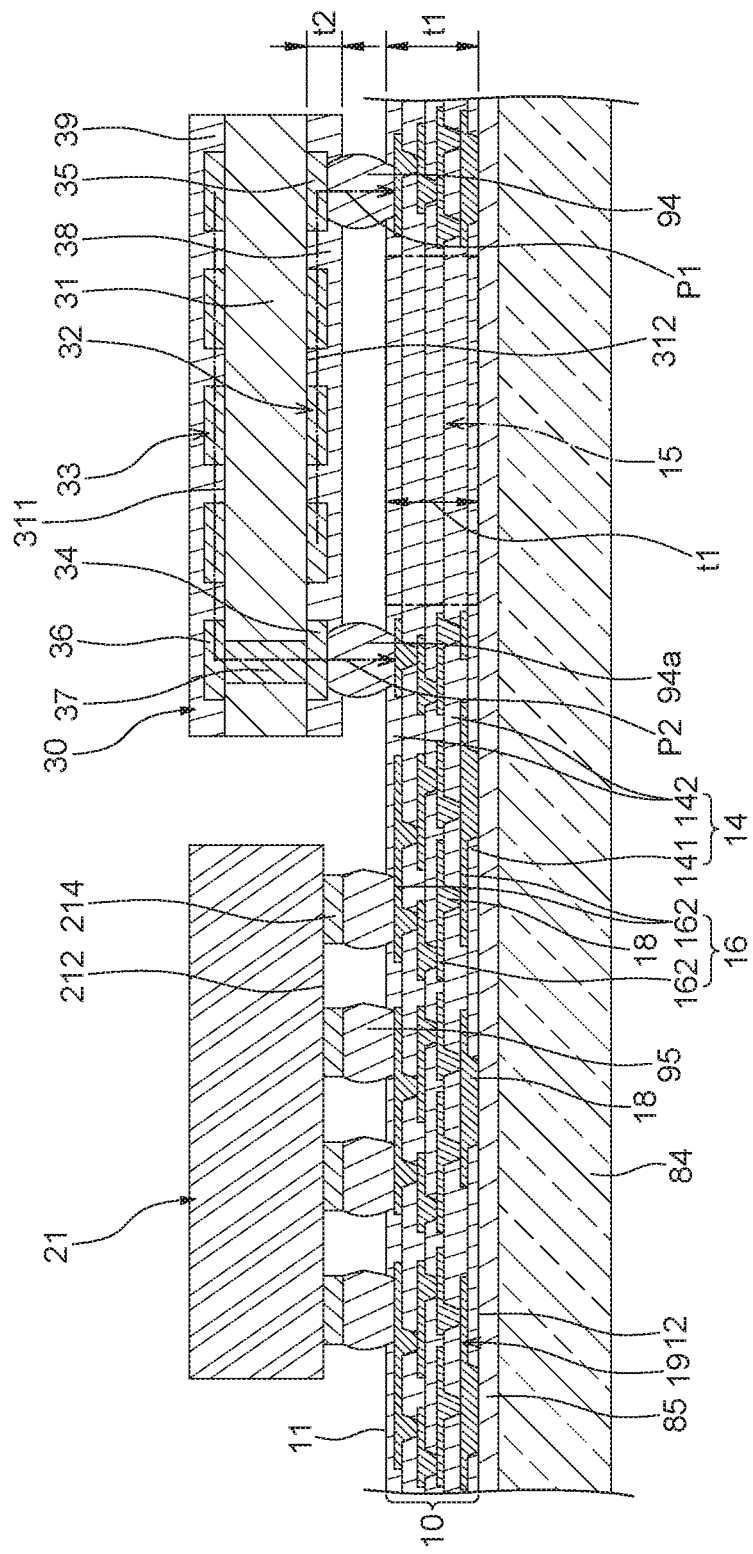
FIG. 13 illustrates one or more stages of an example of a method for manufacturing a semiconductor package structure according to some embodiments of the present disclosure.

Referring to FIG. 13, an impedance matching device (including, for example, a transformer 30) and at least one semiconductor device 21 are electrically connected to the redistribution structure 10. In some embodiments, the impedance matching device (including, for example, the transformer 30) may be spaced apart from the circuitless region 15 by at least one first electrical contact (including, for example, an electrical contact 94 and an electrical contact 94a).

In some embodiments, the impedance matching device (including, for example, the transformer 30) of FIG. 13 may be same as the impedance matching device (including, for example, the transformer 30) of FIG. 1 to FIG. 4.

The semiconductor device 21 (e.g., a power amplifier) of FIG. 13 may be the same as the semiconductor device 21 (e.g., a power amplifier) of FIG. 1 to FIG. 4.

Figure 14:
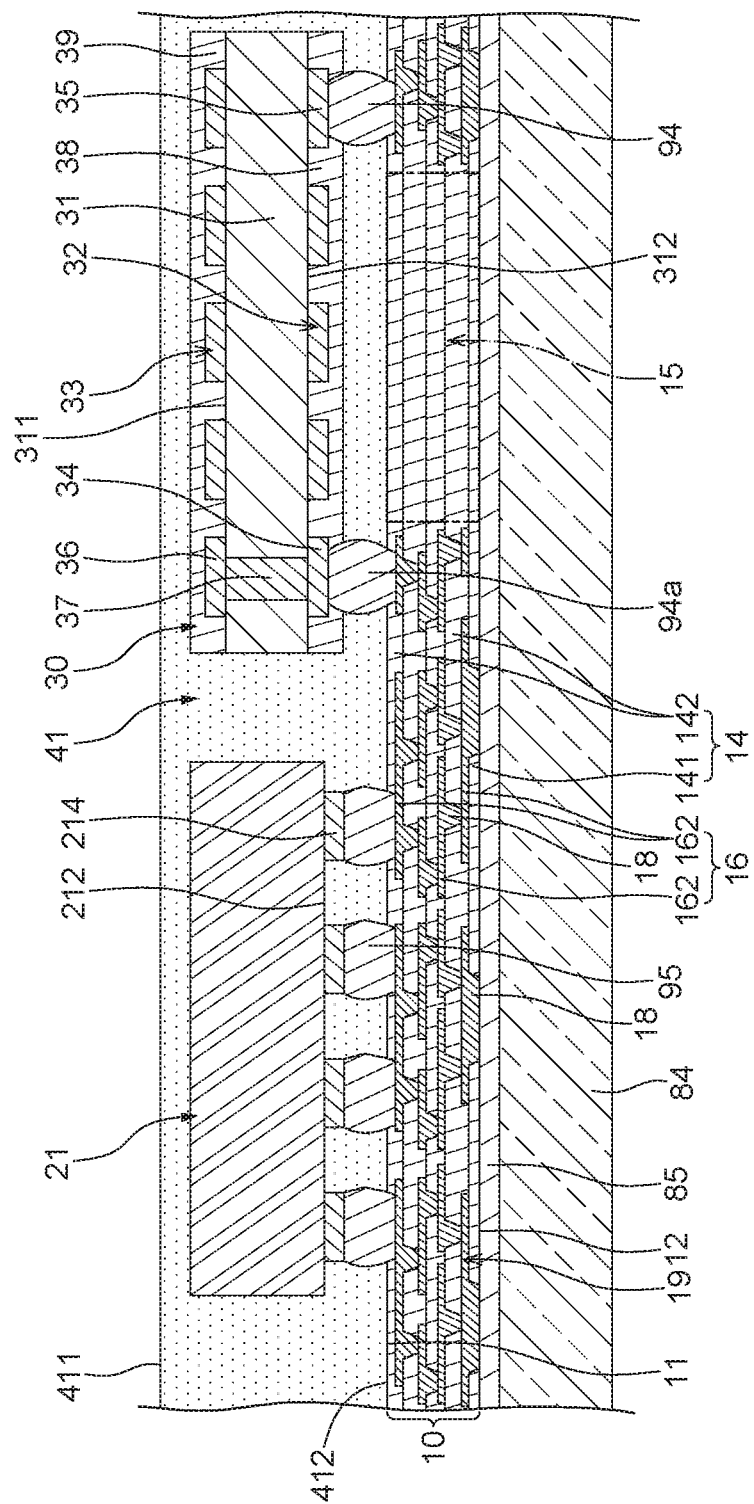
FIG. 14 illustrates one or more stages of an example of a method for manufacturing a semiconductor package structure according to some embodiments of the present disclosure.

Referring to FIG. 14, an encapsulant 41 is formed to encapsulate the semiconductor device 21 and the impedance matching device (including, for example, the transformer 30). A material of the encapsulant 41 may be a molding compound with or without fillers. In some embodiments, a portion of the encapsulant 41 may be disposed between the first impedance matching circuit 32 and the circuitless region 15 of the redistribution structure 10, and further there are no bonding materials (e.g., solder balls or solder bumps) being disposed in the portion of the encapsulant 41. The encapsulant 41 has a top surface 411, a bottom surface 412 opposite to the top surface 411.

Figure 15:
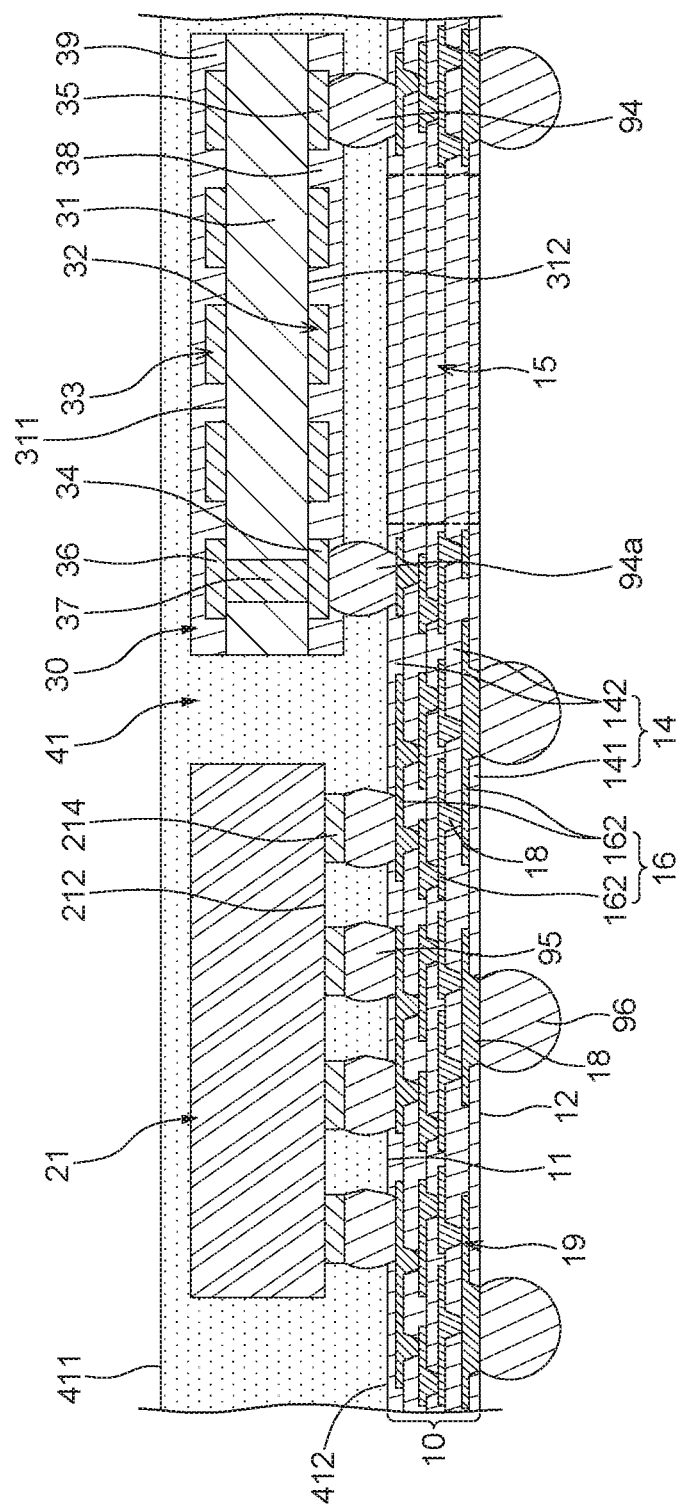
FIG. 15 illustrates one or more stages of an example of a method for manufacturing a semiconductor package structure according to some embodiments of the present disclosure.

Referring to FIG. 15, the carrier 84 and the release layer 85 are removed, and a plurality of third electrical contacts 96 are formed or disposed on the redistribution structure 10 for external connection. In some embodiments, the third electrical contacts 96 may be electrically connected to the inner vias 18 of the redistribution structure 10.

Figure 16:
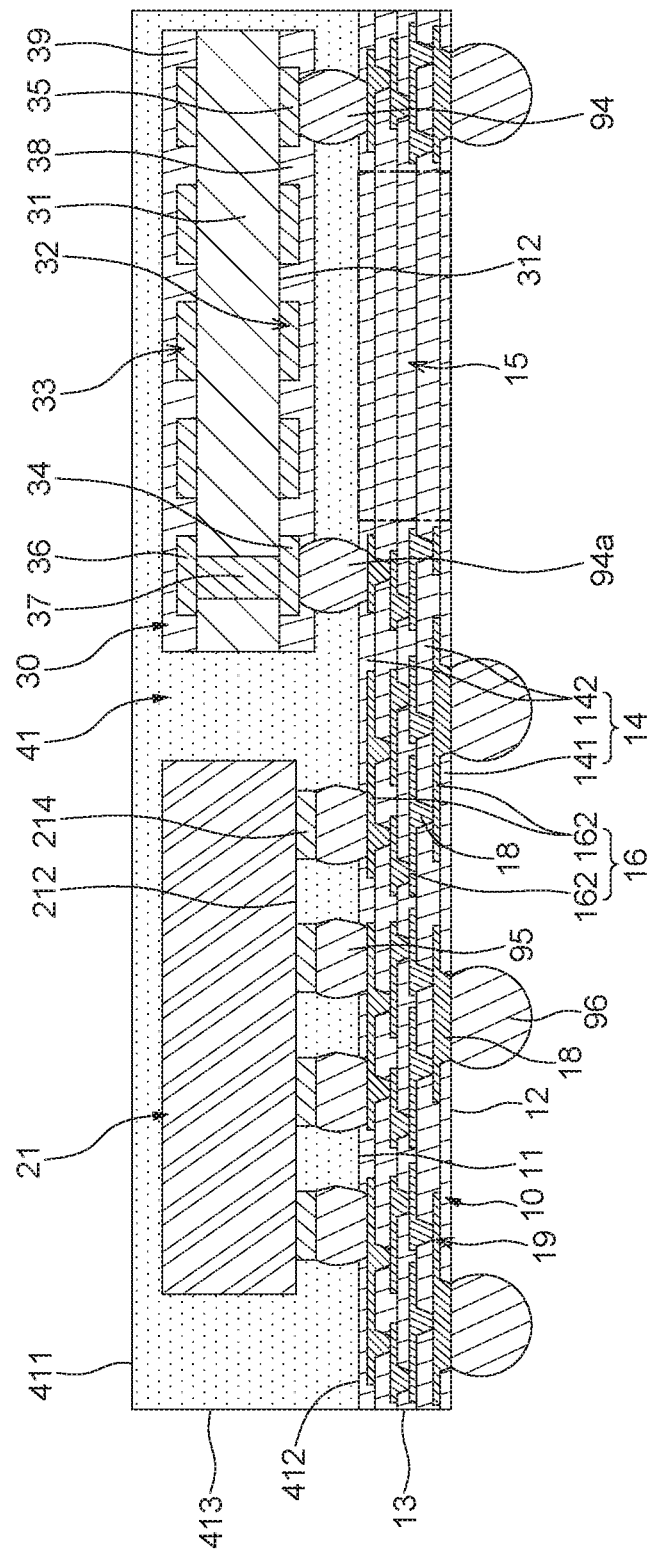
FIG. 16 illustrates one or more stages of an example of a method for manufacturing a semiconductor package structure according to some embodiments of the present disclosure.

Referring to FIG. 16, the encapsulant 41 and the redistribution structure 10 are singulated concurrently to form a peripheral surface 13 of the redistribution structure 10 and a peripheral surface 413 of the encapsulant 41. Then, a shielding layer 91 is formed to cover the encapsulant 41 (e.g., the top surface 411 and the peripheral surface 413) and the peripheral surface 13 of the redistribution structure 10, so as to obtain the semiconductor package structure 1 of FIG. 1. In some embodiments, the shielding layer 91 may be electrically connected to the redistribution structure 10. In some embodiments, the peripheral surface 13 of the redistribution structure 10 may be substantially coplanar with the peripheral surface 413 of the encapsulant 41.

FIG. 17 through FIG. 26 illustrate a method for manufacturing a semiconductor package structure according to some embodiments of the present disclosure. In some embodiments, the method is for manufacturing a semiconductor package structure such as the semiconductor package structure 2 shown in FIG. 3.

Figure 17:
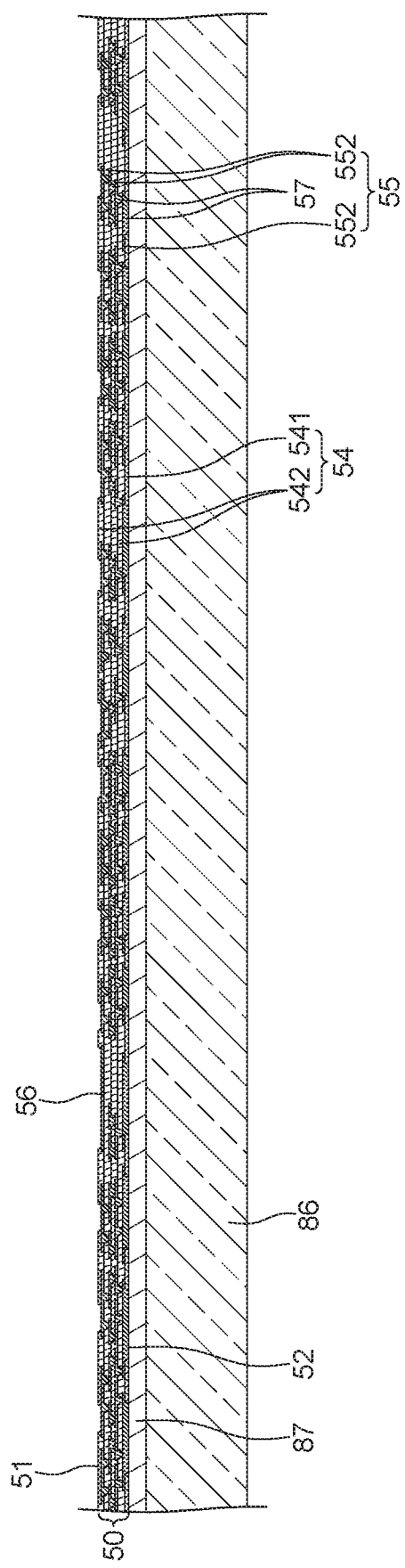
FIG. 17 illustrates one or more stages of an example of a method for manufacturing a semiconductor package structure according to some embodiments of the present disclosure.

Referring to FIG. 17, a conductive structure 50 is provided. The conductive structure 50 is attached to a release layer 87 that is formed or disposed on a carrier 86. The conductive structure 50 of FIG. 17 may be the same as the conductive structure 50 of FIG. 3 and FIG. 4.

Figure 18:
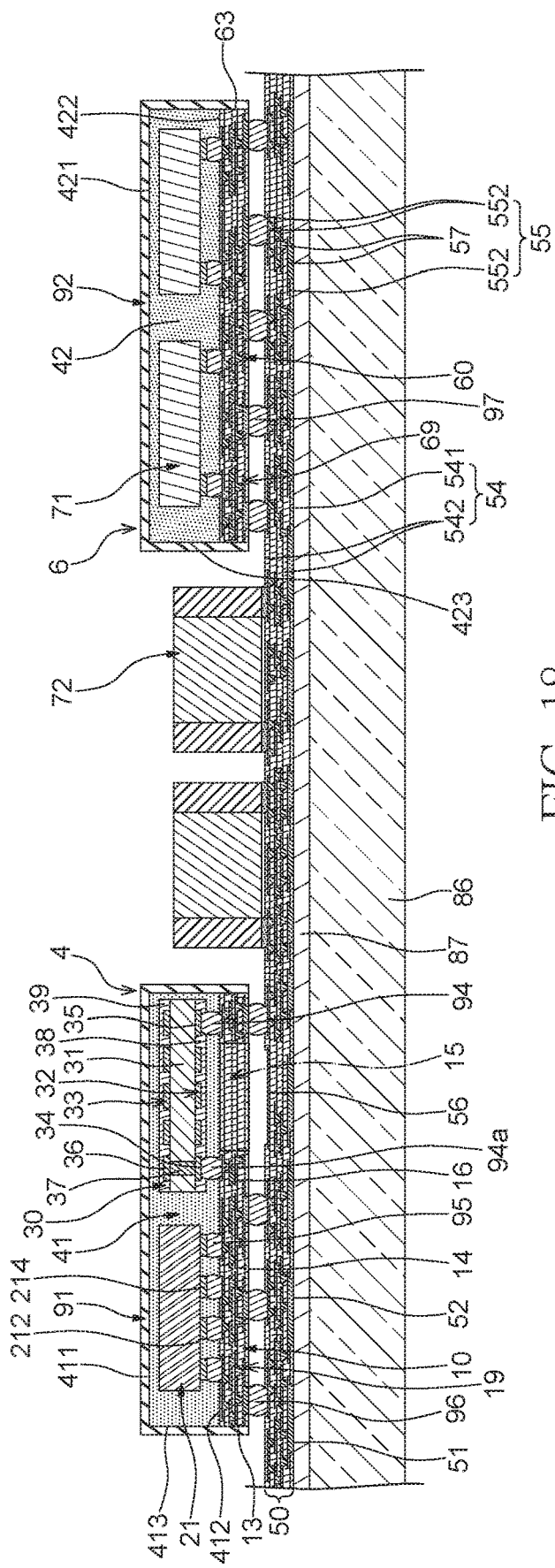
FIG. 18 illustrates one or more stages of an example of a method for manufacturing a semiconductor package structure according to some embodiments of the present disclosure.

Referring to FIG. 18, a first impedance-matchable device 4, a second impedance-matchable device 6 and at least one impedance-matchable device 72 are disposed on the conductive structure 50. In some embodiments, a resolution of the first impedance-matchable device 4 may be different from a resolution of the second impedance-matchable device 6. Further, the first impedance-matchable device 4 may align with the conductive layer 56 (e.g., the ground plane) of the conductive structure 50. The first impedance-matchable device 4 of FIG. 18 may be the same as the lower resolution impedance-matchable device 4 of FIG. 3 and FIG. 4. The second impedance-matchable device 6 of FIG. 18 may be the same as the higher resolution impedance-matchable device 6 of FIG. 3 and FIG. 4. The impedance-matchable device 72 of FIG. 18 may be the same as the impedance-matchable device 72 of FIG. 3.

Figure 19:
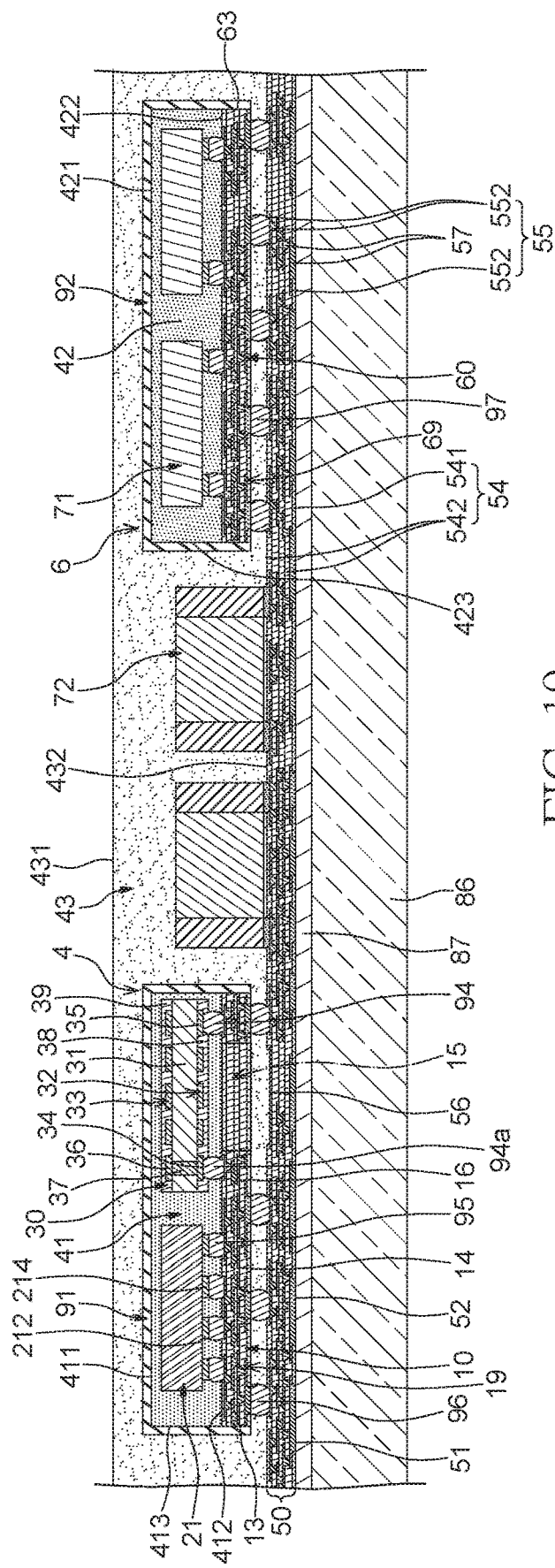
FIG. 19 illustrates one or more stages of an example of a method for manufacturing a semiconductor package structure according to some embodiments of the present disclosure.

Referring to FIG. 19, an encapsulant 43 is formed on the conductive structure 50 to encapsulate the first impedance-matchable device 4, the second impedance-matchable device 6 and the impedance-matchable device 72. That is, the first shielding layer 91 may be disposed between the first encapsulant 41 and the encapsulant 43, and the second shielding layer 92 may be disposed between the second encapsulant 42 and the encapsulant 43. In some embodiments, the encapsulant 43 of FIG. 19 may be the same as the encapsulant 43 of FIG. 3 and FIG. 4.

Figure 20:
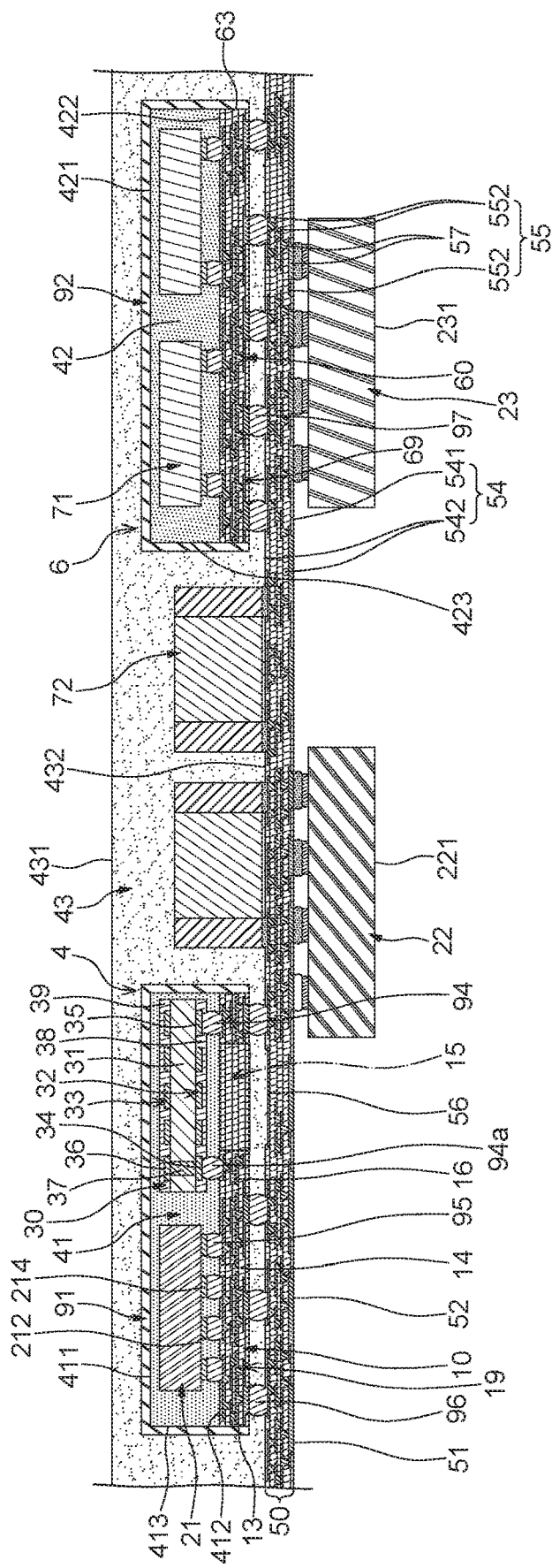
FIG. 20 illustrates one or more stages of an example of a method for manufacturing a semiconductor package structure according to some embodiments of the present disclosure.

Referring to FIG. 20, the carrier 86 and the release layer 87 are removed, and at least one semiconductor device (including, for example, a semiconductor device 22 and a semiconductor device 23) is disposed on the lower surface 52 of the conductive structure 50. In some embodiments, the semiconductor device (including, for example, the semiconductor device 22 and the semiconductor device 23) of FIG. 20 may be the same as the semiconductor device (including, for example, the semiconductor device 22 and the semiconductor device 23) of FIG. 3 and FIG. 4.

Figure 21:
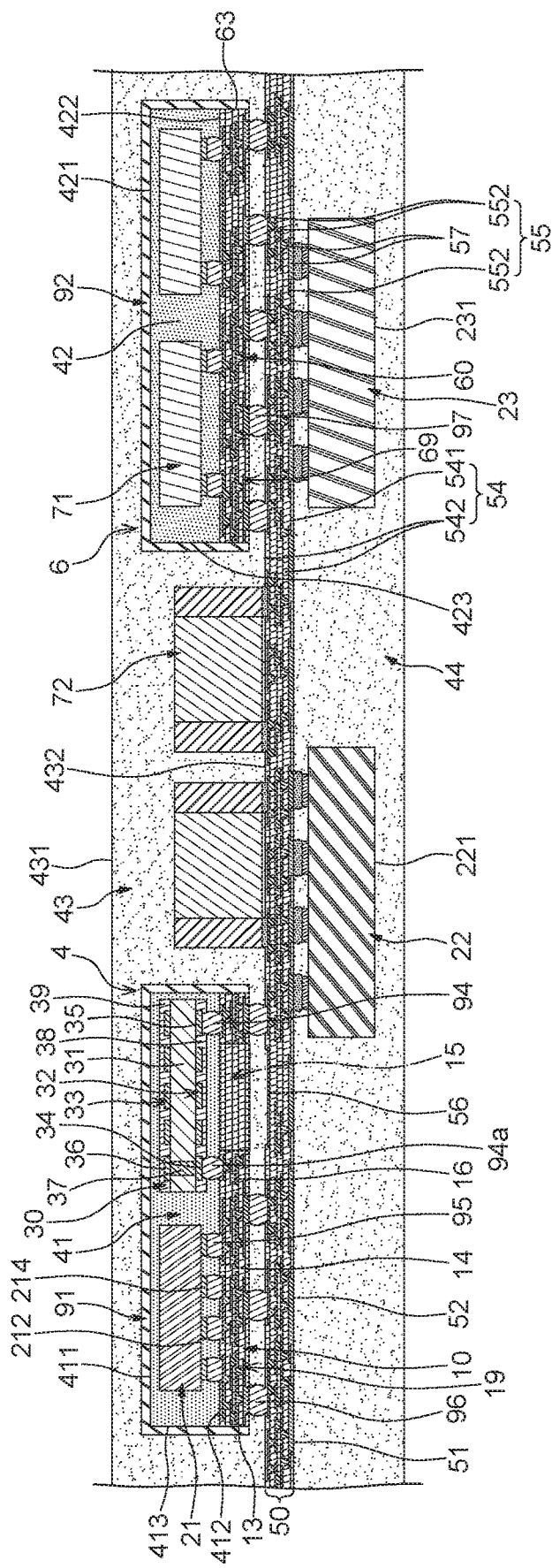
FIG. 21 illustrates one or more stages of an example of a method for manufacturing a semiconductor package structure according to some embodiments of the present disclosure.

Referring to FIG. 21, an encapsulant 44 is formed on the lower surface 52 of the conductive structure 50 to encapsulate the semiconductor device (including, for example, the semiconductor device 22 and the semiconductor device 23).

Figure 22:
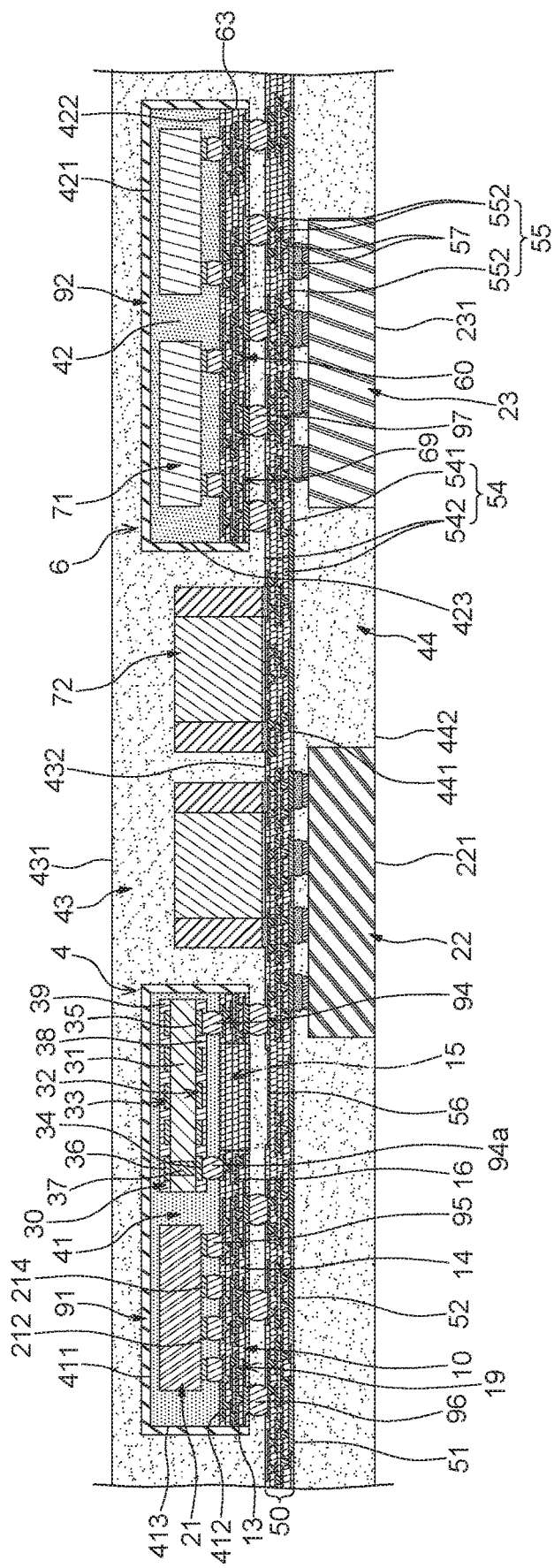
FIG. 22 illustrates one or more stages of an example of a method for manufacturing a semiconductor package structure according to some embodiments of the present disclosure.

Referring to FIG. 22, a portion of the encapsulant 44 is removed through, for example, grinding, to expose the bottom surface (including, for example, the bottom surface 221 and the bottom surface 231) of the semiconductor device (including, for example, the semiconductor device 22 and the semiconductor device 23). In some embodiments, the bottom surface (including, for example, the bottom surface 221 and the bottom surface 231) of the semiconductor device (including, for example, the semiconductor device 22 and the semiconductor device 23) may be substantially coplanar with a bottom surface 442 of the encapsulant 44.

Figure 23:
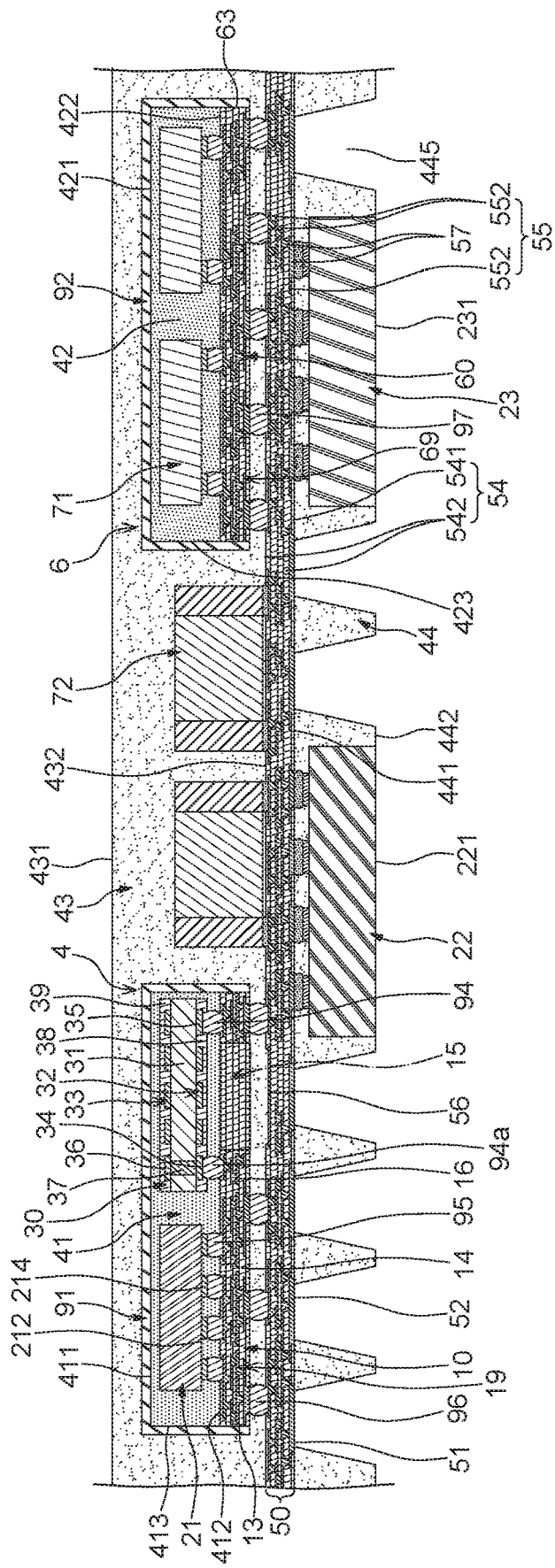
FIG. 23 illustrates one or more stages of an example of a method for manufacturing a semiconductor package structure according to some embodiments of the present disclosure.

Referring to FIG. 23, at least one opening 445 is formed to extend through the encapsulant 44 to expose a portion (e.g., a portion of the inner via 57) of the conductive structure 50.

Figure 24:
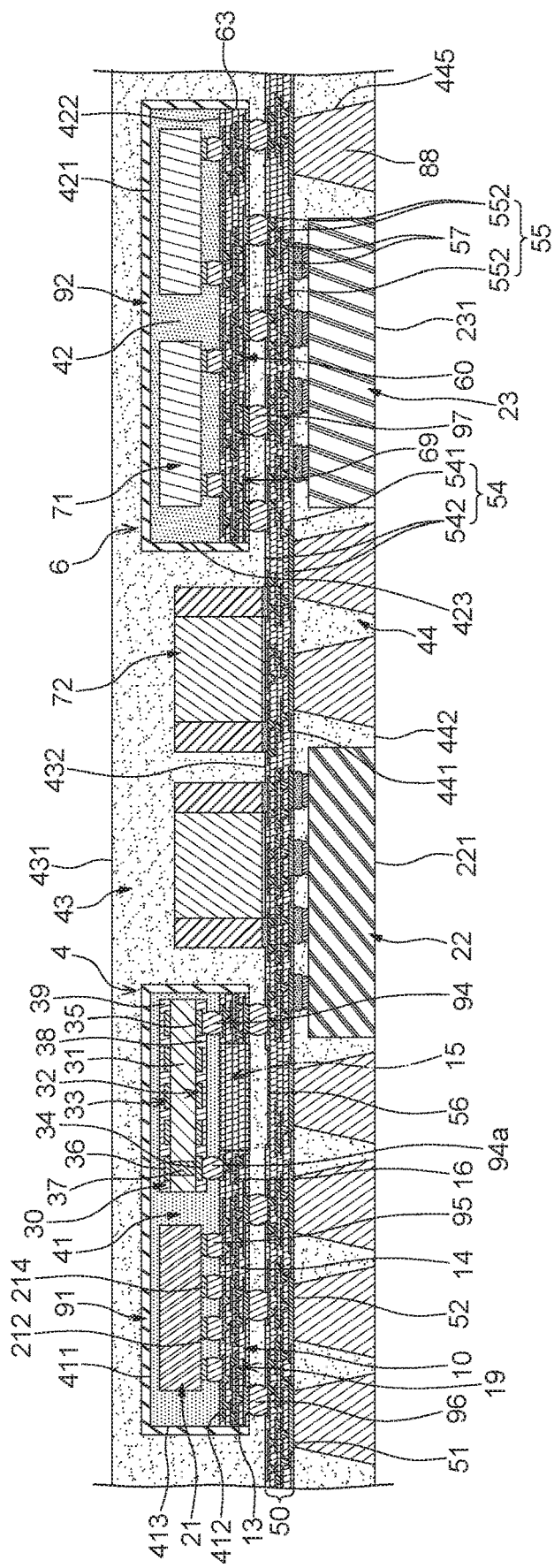
FIG. 24 illustrates one or more stages of an example of a method for manufacturing a semiconductor package structure according to some embodiments of the present disclosure.

Referring to FIG. 24, a solder material 88 is formed in the opening 445 and on the exposed portion (e.g., the exposed portion of the inner via 57) of the conductive structure 50. In some embodiments, a bottom surface of the solder material 88 may be substantially coplanar with the bottom surface 442 of the encapsulant 44.

Figure 25:
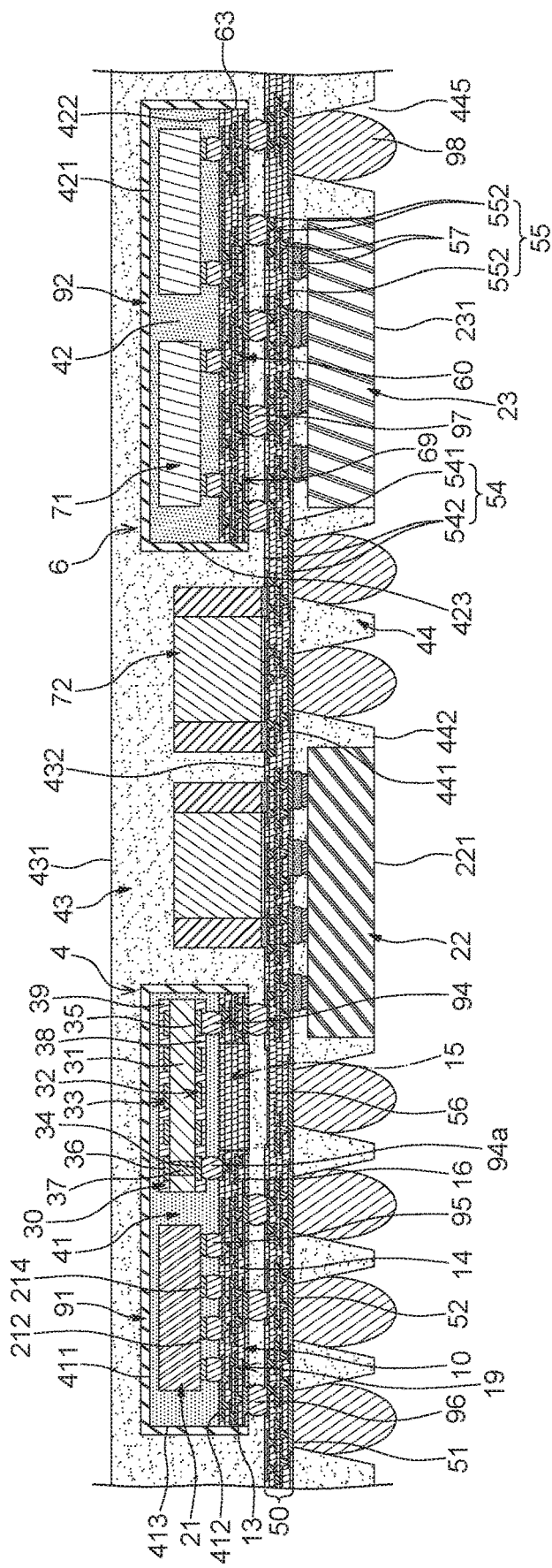
FIG. 25 illustrates one or more stages of an example of a method for manufacturing a semiconductor package structure according to some embodiments of the present disclosure.

Referring to FIG. 25, the solder material 88 is reflowed to form at least one electrical element 98 in the opening 445 and on the exposed portion (e.g., the exposed portion of the inner via 57) of the conductive structure 50 for external connection. In some embodiments, a lower portion of the electrical element 98 may protrude downward from the bottom surface 442 of the encapsulant 44.

Figure 26:
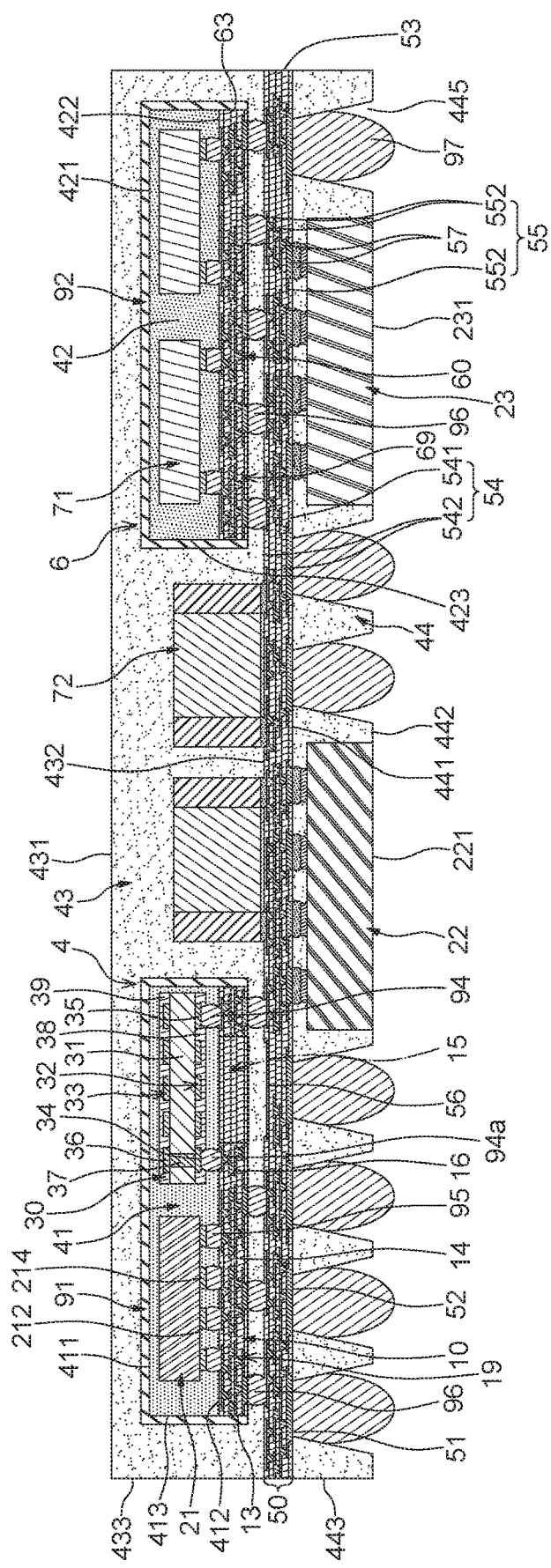
FIG. 26 illustrates one or more stages of an example of a method for manufacturing a semiconductor package structure according to some embodiments of the present disclosure.

Referring to FIG. 26, the encapsulant 43, the encapsulant 44 and the conductive structure 50 are singulated concurrently to form a peripheral surface 433 of the encapsulant 43, a peripheral surface 53 of the conductive structure 50 and a peripheral surface 443 of the encapsulant 44. Then, a shielding cover 93 is formed to cover the encapsulant 43 (e.g., the top surface 431 and the peripheral surface 433), the peripheral surface 53 of the conductive structure 50 and the peripheral surface 443 of the encapsulant 44, so as to obtain the semiconductor package structure 2 of FIG. 3.

FIG. 27 through FIG. 36 illustrate a method for manufacturing a semiconductor package structure according to some embodiments of the present disclosure. In some embodiments, the method is for manufacturing a semiconductor package structure such as the semiconductor package structure 3 shown in FIG. 10.

Figure 27:
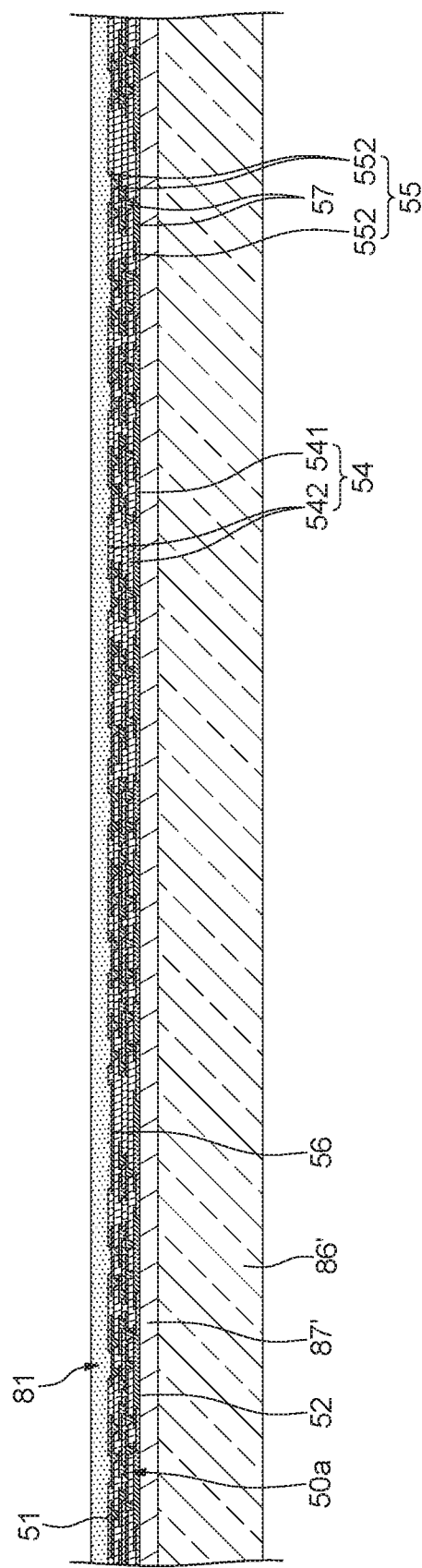
FIG. 27 illustrates one or more stages of an example of a method for manufacturing a semiconductor package structure according to some embodiments of the present disclosure.

Referring to FIG. 27, a first circuit portion 50a is provided, and an adhesive layer 81 is formed or disposed on the first circuit portion 50a. The first circuit portion 50a is attached to a release layer 87' that is formed or disposed on a carrier 86'. The first circuit portion 50a of FIG. 27 may be the same as the first circuit portion 50a of FIG. 10. In some embodiments, the adhesive layer 81 may be formed or disposed on the upper surface 51 of the first circuit portion 50a. Further, the adhesive layer 81 may cover the conductive layer 56 (e.g., the ground plane).

Figure 28:
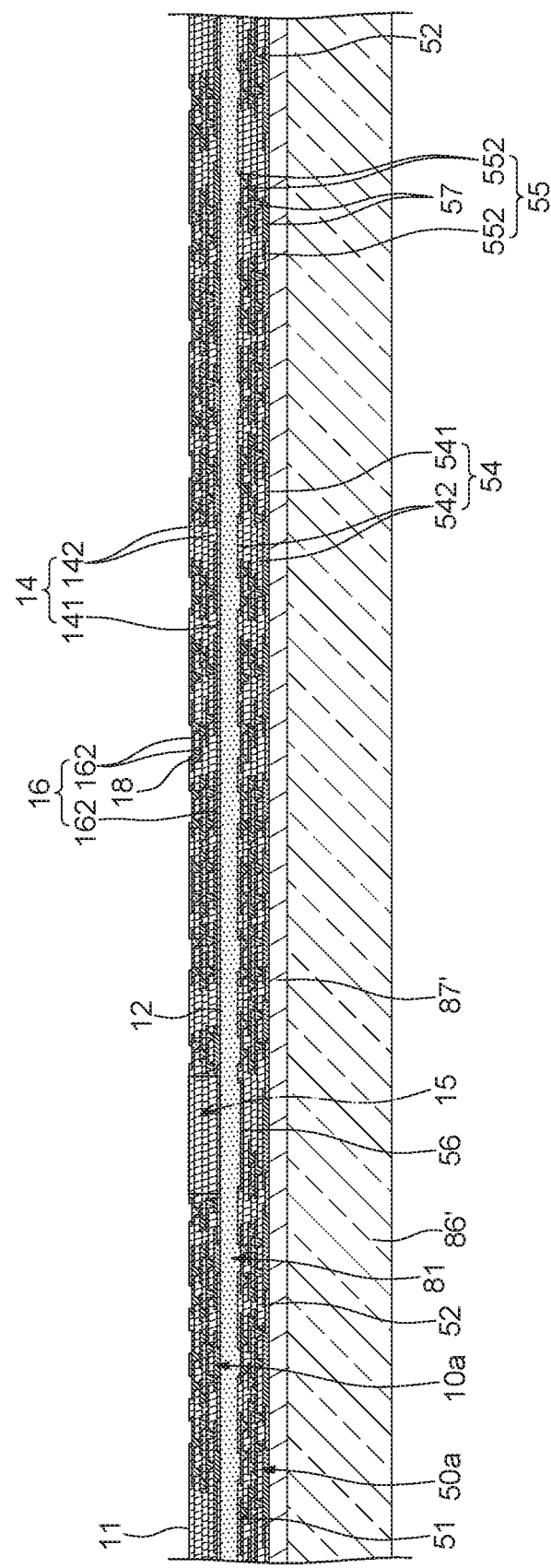
FIG. 28 illustrates one or more stages of an example of a method for manufacturing a semiconductor package structure according to some embodiments of the present disclosure.

Referring to FIG. 28, a second circuit portion 10a is bonded to the first circuit portion 50a through the adhesive layer 81 that may be disposed between the first circuit portion 50a and the second circuit portion 10a. In some embodiments, the second circuit portion 10a of FIG. 28 may be the same as the first circuit portion 50a of FIG. 10.

Figure 29:
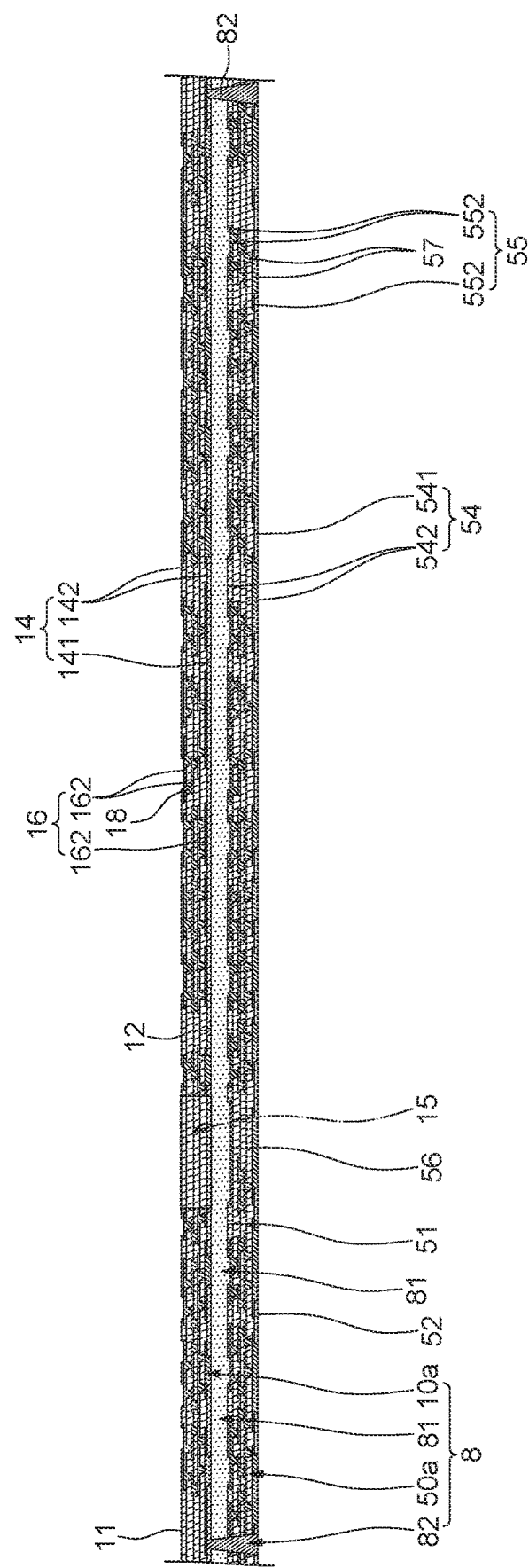
FIG. 29 illustrates one or more stages of an example of a method for manufacturing a semiconductor package structure according to some embodiments of the present disclosure.

Referring to FIG. 29, the carrier 86' and the release layer 87' are removed, and at least one conductive via 82 is formed to electrically connect the first circuit portion 50a to the second circuit portion 10a. Thus, the first circuit portion 50a, the second circuit portion 10a, the adhesive layer 81 and the conductive via 82 may constitute a conductive structure 8. In some embodiments, the conductive via 82 of FIG. 29 may be the same as the conductive via 82 of FIG. 10.

Figure 30:
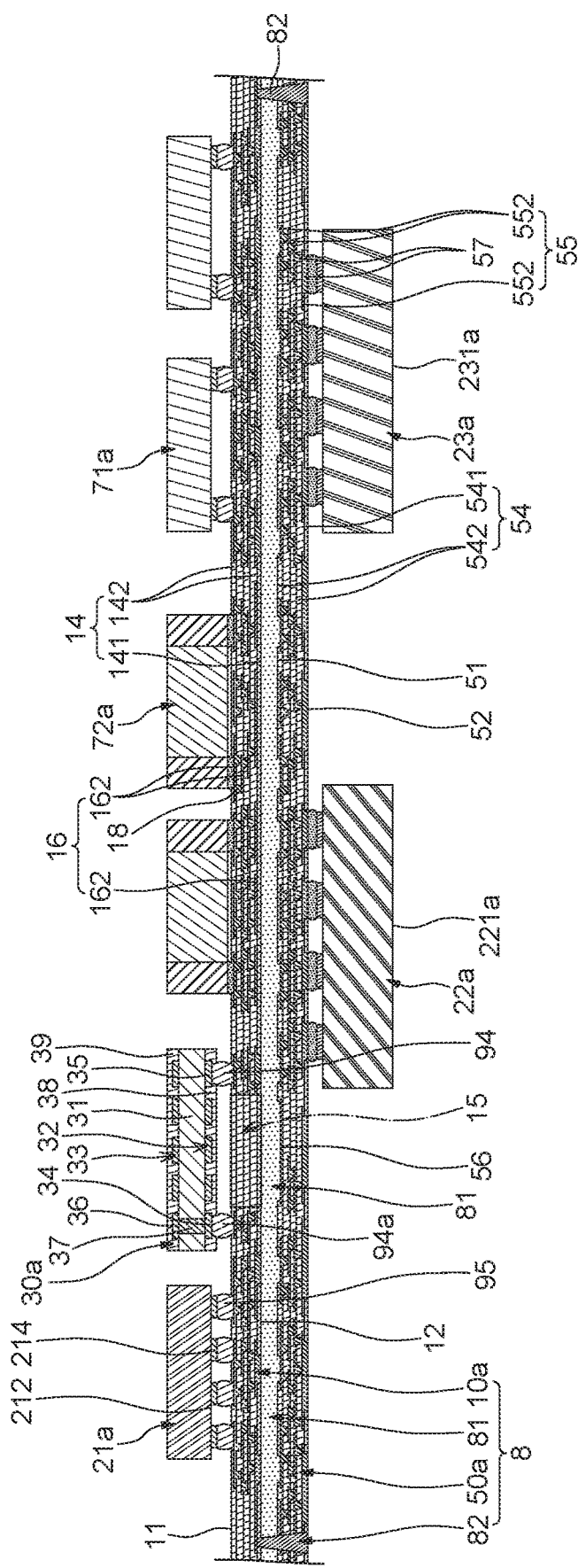
FIG. 30 illustrates one or more stages of an example of a method for manufacturing a semiconductor package structure according to some embodiments of the present disclosure.

Referring to FIG. 30, an impedance matching device (including, for example, a transformer 30a), at least one first semiconductor device 21a, at least one electronic component 71a and at least one impedance-matchable device 72a are disposed on the second circuit portion 10a, and at least one second semiconductor device (including, for example, a second semiconductor device 22a and a second semiconductor device 23a) is disposed on the first circuit portion 50a. The impedance matching device (including, for example, the transformer 30a) of FIG. 30 may be the same as the impedance matching device (including, for example, the transformer 30a) of FIG. 10. The first semiconductor device 21a of FIG. 30 may be the same as the first semiconductor device 21a of FIG. 10. The electronic component 71a of FIG. 30 may be the same as the electronic component 71a of FIG. 10. The impedance-matchable device 72a of FIG. 30 may be the same as the impedance-matchable device 72a of FIG. 10. The second semiconductor device (including, for example, the second semiconductor device 22a and the second semiconductor device 23a) of FIG. 30 may be the same as the second semiconductor device (including, for example, the second semiconductor device 22a and the second semiconductor device 23a) of FIG. 10.

Figure 31:
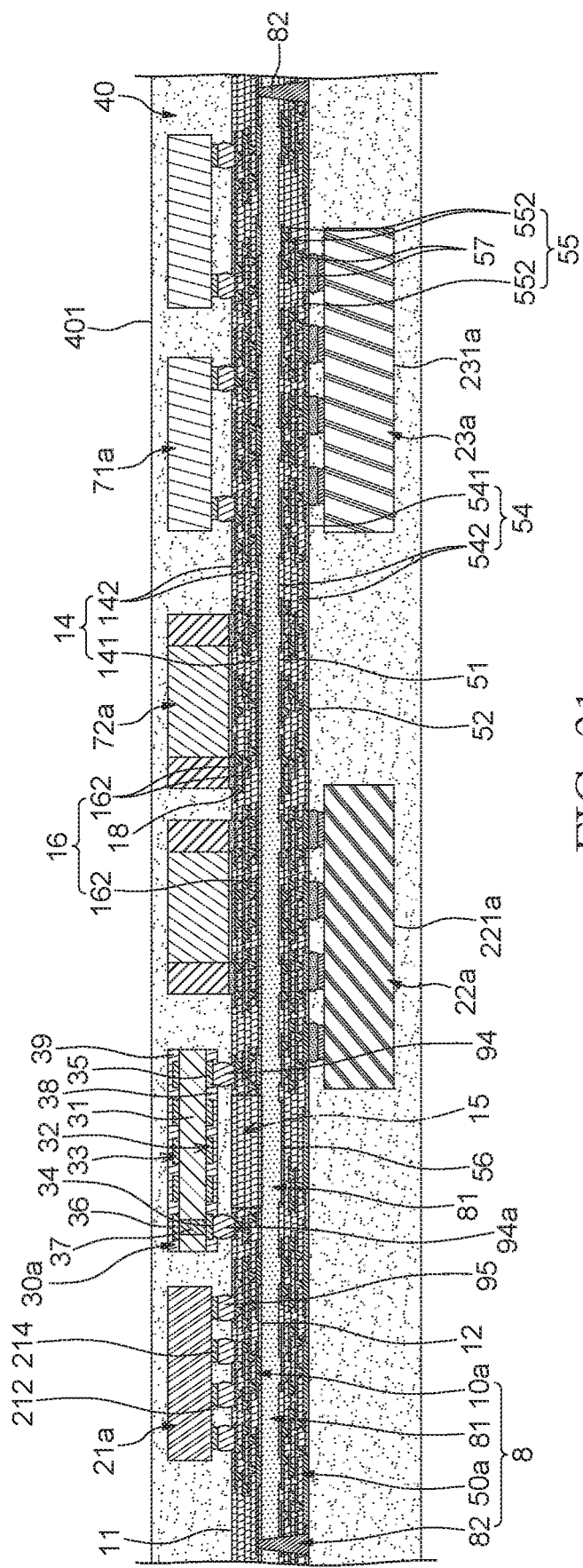
FIG. 31 illustrates one or more stages of an example of a method for manufacturing a semiconductor package structure according to some embodiments of the present disclosure.

Referring to FIG. 31, an encapsulant 40 is formed to encapsulate the first circuit portion 50a, the second circuit portion 10a, the impedance matching device (including, for example, the transformer 30a), the first semiconductor device 21a, the electronic component 71a, the impedance-matchable device 72a and the second semiconductor device (including, for example, the second semiconductor device 22a and the second semiconductor device 23a). In some embodiments, the encapsulant 40 may include a lower portion below the first circuit portion 50a and an upper portion above the second circuit portion 10a.

Figure 32:
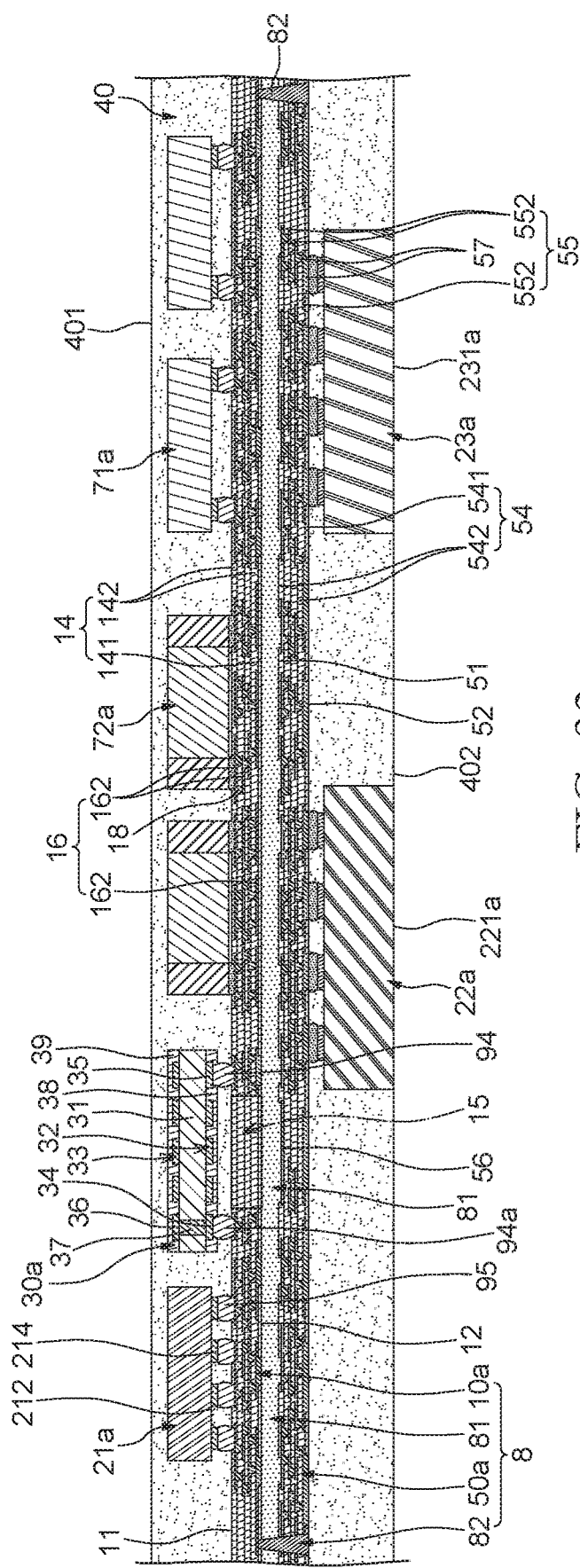
FIG. 32 illustrates one or more stages of an example of a method for manufacturing a semiconductor package structure according to some embodiments of the present disclosure.

Referring to FIG. 32, a portion (e.g., a portion of the lower portion) of the encapsulant 40 is removed through, for example, grinding, to expose a bottom surface (including, for example, a bottom surface 221a and a bottom surface 231a) of the second semiconductor device (including, for example, the second semiconductor device 22a and the second semiconductor device 23a). In some embodiments, the bottom surface (including, for example, the bottom surface 221a and the bottom surface 231a) of the second semiconductor device (including, for example, the second semiconductor device 22a and the second semiconductor device 23a) may be substantially coplanar with a bottom surface 402 of the encapsulant 40.

Figure 33:
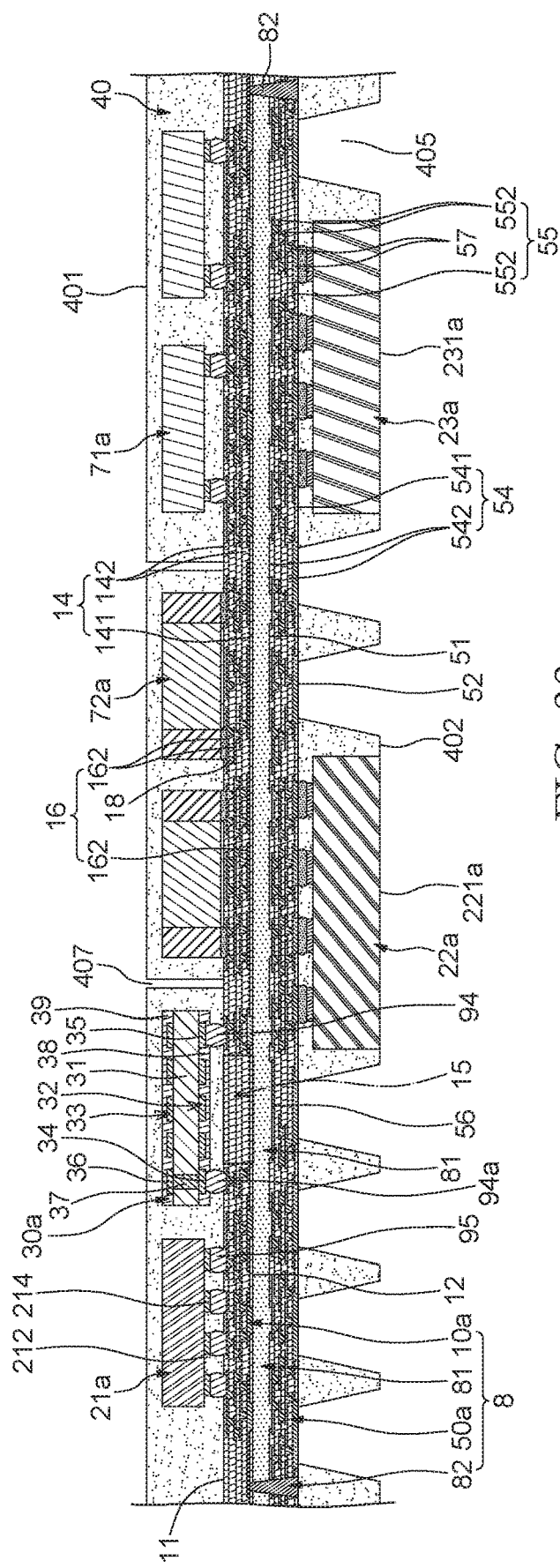
FIG. 33 illustrates one or more stages of an example of a method for manufacturing a semiconductor package structure according to some embodiments of the present disclosure.

Referring to FIG. 33, at least one opening 405 is formed to extend through the lower portion of the encapsulant 40 to expose a portion (e.g., a portion of the inner via 57) of the first circuit portion 50a, and at least one through hole 407 is formed to extend through the upper portion of the encapsulant 40 to expose a portion (e.g., a portion of the first surface 11) of the second circuit portion 10a.

Figure 34:
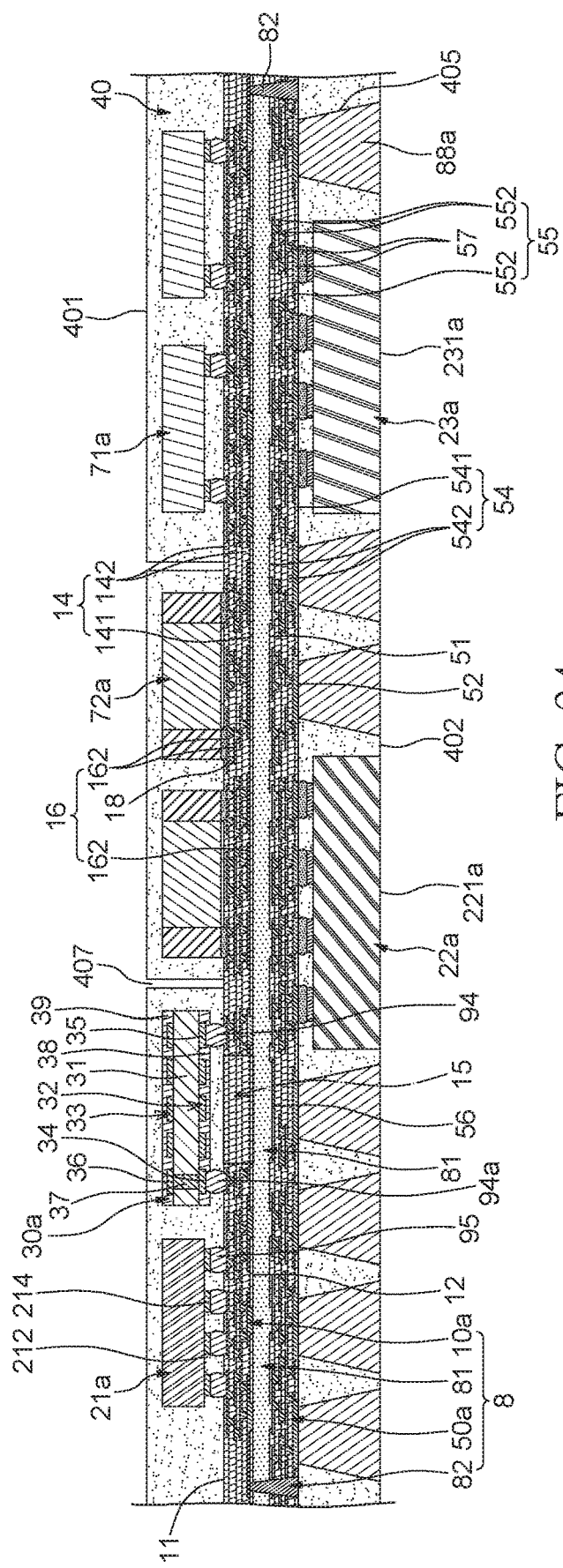
FIG. 34 illustrates one or more stages of an example of a method for manufacturing a semiconductor package structure according to some embodiments of the present disclosure.

Referring to FIG. 34, a solder material 88a is formed in the opening 405 and on the exposed portion (e.g., the exposed portion of the inner via 57) of the first circuit portion 50a. In some embodiments, a bottom surface of the solder material 88a may be substantially coplanar with the bottom surface 402 of the encapsulant 40.

Figure 35:
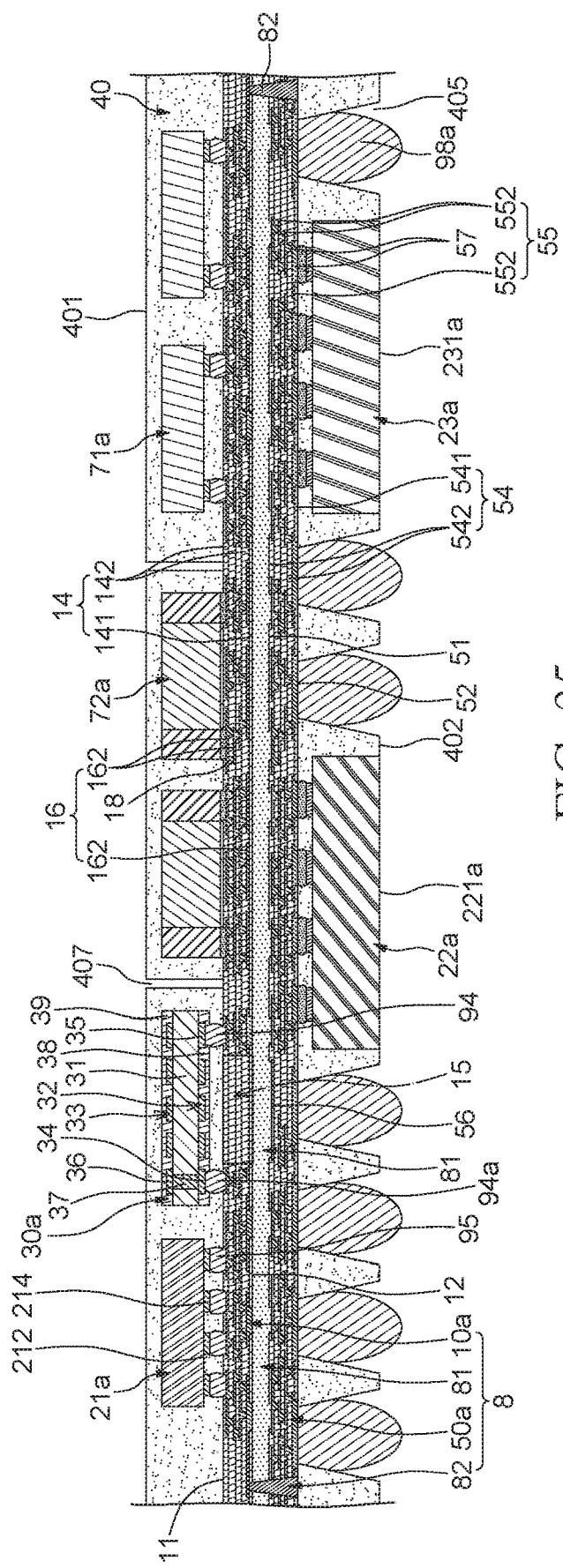
FIG. 35 illustrates one or more stages of an example of a method for manufacturing a semiconductor package structure according to some embodiments of the present disclosure.

Referring to FIG. 35, the solder material 88a is reflowed to form at least one electrical element 98a in the opening 405 and on the exposed portion (e.g., the exposed portion of the inner via 57) of the first circuit portion 50a for external connection. In some embodiments, a lower portion of the electrical element 98a may protrude downward from the bottom surface 402 of the encapsulant 40.

Figure 36:
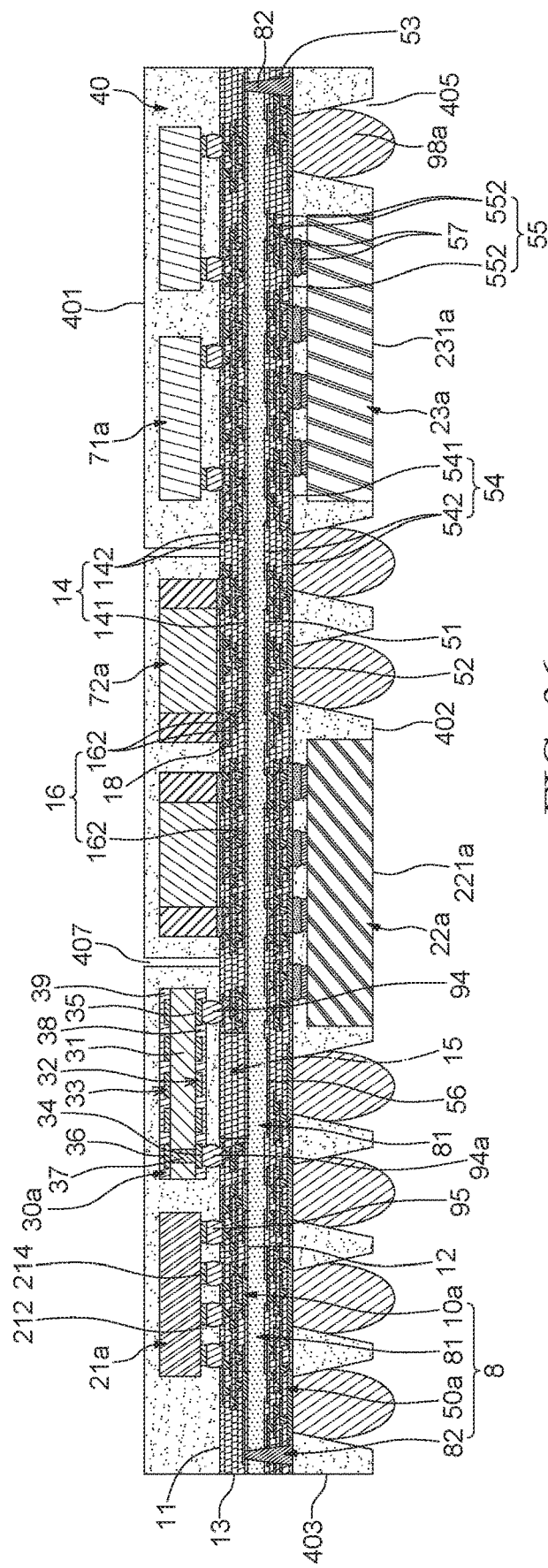
FIG. 36 illustrates one or more stages of an example of a method for manufacturing a semiconductor package structure according to some embodiments of the present disclosure.

Referring to FIG. 36, the encapsulant 40, the first circuit portion 50a and the second circuit portion 10a are singulated concurrently to form a peripheral surface 403 of the encapsulant 40, a peripheral surface 53 of the first circuit portion 50a and a peripheral surface 13 of the second circuit portion 10a. Then, a shielding cover 93b is formed to cover the encapsulant 40 (e.g., the top surface 401, the peripheral surface 403 and the through hole 407), the peripheral surface 53 of the first circuit portion 50a and the peripheral surface 13 of the second circuit portion 10a, so as to obtain the semiconductor package structure 3 of FIG. 10.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a redistribution structure including a first surface, a second surface opposite to the first surface and a circuitless region extending from the first surface to the second surface;
   an impedance matching device disposed on the redistribution structure and including at least one impedance matching circuit aligned with the circuitless region;
   an electronic device disposed on the redistribution structure and electrically connected to the impedance matching device through the redistribution structure;
   an encapsulant encapsulating the electronic device and the impedance matching device; and
   a shielding structure covering the encapsulant and electrically connected to the redistribution structure.

2. The semiconductor package structure of claim 1, wherein a thickness of the circuitless region is substantially equal to a thickness of the redistribution structure from the first surface to the second surface.

3. The semiconductor package structure of claim 1, wherein a projection area of the impedance matching circuit falls within the circuitless region.

4. The semiconductor package structure of claim 1, wherein the redistribution structure further includes a redistribution layer disposed outside the circuitless region.

5. The semiconductor package structure of claim 1, wherein a portion of the encapsulant is disposed between the impedance matching circuit of the impedance matching device and the circuitless region of the redistribution structure.

6. A semiconductor package structure, comprising:
- a conductive structure having an upper surface and a lower surface opposite to the upper surface;
- a lower resolution impedance-matchable device disposed on the conductive structure and including a redistribution structure and a first electronic component disposed on the redistribution structure;
- a higher resolution impedance-matchable device disposed on the conductive structure; and
- at least one electrical element disposed on the lower surface of the conductive structure.

7. The semiconductor package structure of claim 6, wherein the first electronic component includes an impedance matching component, the redistribution structure includes a first surface, a second surface opposite to the first surface and a circuitless region extending from the first surface to the second surface, and the circuitless region aligns with the impedance matching component.

8. The semiconductor package structure of claim 7, wherein the impedance matching component includes a transformer.

9. The semiconductor package structure of claim 7, wherein the conductive structure includes a conductive layer, and the conductive layer serves as a ground plane aligning with the impedance matching component.

10. The semiconductor package structure of claim 6, wherein the higher resolution impedance-matchable device includes a redistribution structure, an impedance-matching circuit disposed in the redistribution structure of the higher resolution impedance-matchable device and at least one electronic component disposed on the redistribution structure of the higher resolution impedance-matchable device.

11. The semiconductor package structure of claim 10, wherein the electronic component of the higher resolution impedance-matchable device includes a filter.

12. The semiconductor package structure of claim 10, further comprising a second electronic component disposed on the redistribution structure of the lower resolution impedance-matchable device,
wherein the lower resolution impedance-matchable device further includes a first encapsulant and a first shielding layer, the first encapsulant encapsulates the redistribution structure of the lower resolution impedance-matchable device, the first electronic component and the second electronic component, and the first shielding layer is disposed on the first encapsulant and electrically connected to the redistribution structure of the lower resolution impedance-matchable device,
wherein the higher resolution impedance-matchable device further includes a second encapsulant and a second shielding layer, the second encapsulant encapsulates the redistribution structure of the higher resolution impedance-matchable device and the electronic component, and the second shielding layer is disposed on the second encapsulant and electrically connected to the redistribution structure of the higher resolution impedance-matchable device.

13. The semiconductor package structure of claim 6, further comprising at least one impedance-matchable device disposed on the conductive structure, a resolution of the impedance-matchable device is between the lower resolution impedance-matchable device and the higher resolution impedance-matchable device.

14. The semiconductor package structure of claim 13, further comprising an encapsulant encapsulating the lower resolution impedance-matchable device, the higher resolution impedance-matchable device and the impedance-matchable device.

15. The semiconductor package structure of claim 14, further comprising:
- at least one semiconductor device disposed on the lower surface of the conductive structure; and
- an encapsulant encapsulating the semiconductor device and the electrical element.

16. The semiconductor package structure of claim 6, wherein the conductive structure including a first circuit portion, a second circuit portion, an adhesive layer disposed between the first circuit portion and the second circuit portion and at least one conductive via electrically connecting the first circuit portion to the second circuit portion through the adhesive layer.

17. A semiconductor package structure, comprising:
- a redistribution structure including a first surface, a second surface opposite to the first surface and a circuitless region extending from the first surface to the second surface; and
- an impedance matching device disposed on the redistribution structure and including at least one impedance matching circuit aligned with the circuitless region, wherein the impedance matching device is spaced apart from the circuitless region by an electrical contact.

18. The semiconductor package structure of claim 17, wherein the impedance matching device includes a transformer.

* * * * *